(12) United States Patent
Sato et al.

(10) Patent No.: US 6,542,528 B1
(45) Date of Patent: Apr. 1, 2003

(54) LIGHT-EMITTING SEMICONDUCTOR DEVICE PRODUCING RED WAVELENGTH OPTICAL RADIATION

(75) Inventors: Shunichi Sato, Miyagi (JP); Takashi Takahashi, Miyagi (JP); Naoto Jikutani, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/502,802

(22) Filed: Feb. 11, 2000

(30) Foreign Application Priority Data

| Feb. 15, 1999 | (JP) | ............................................. 11-035455 |
| Apr. 19, 1999 | (JP) | ............................................. 11-110548 |
| Jul. 1, 1999 | (JP) | ............................................. 11-187493 |
| Jul. 9, 1999 | (JP) | ............................................. 11-195960 |

(51) Int. Cl.⁷ ................................................. H01S 5/00
(52) U.S. Cl. ............................................ 372/45; 372/44
(58) Field of Search ...................................... 372/44–46

(56) References Cited

U.S. PATENT DOCUMENTS 5,751,753 A  *  5/1998  Uchida ........................ 372/45
6,127,691 A  * 10/2000  Fukunaga et al. ............. 257/17

FOREIGN PATENT DOCUMENTS

| JP | 4114486 | 4/1992 |
| JP | 5-41560 | 2/1993 |
| JP | 6053602 | 2/1994 |
| JP | 6077592 | 3/1994 |
| JP | 6275915 | 9/1994 |
| JP | 7235733 | 9/1995 |

* cited by examiner

*Primary Examiner*—Paul Ip
*Assistant Examiner*—James Menefee
(74) *Attorney, Agent, or Firm*—Cooper & Dunham LLP

(57) ABSTRACT

A light-emitting semiconductor device for producing red color optical radiation has a cladding layer of AlGaInPAs having a lattice constant between GaAs and GaP. Further, the laser diode uses an optical waveguide layer in the system of GaInPAs free from Al. The semiconductor device may be constructed on a GaPAs substrate.

63 Claims, 22 Drawing Sheets

PRESENT INVENTION

20 μm

LIGHT-EMITTING SEMICONDUCTOR DEVICE PRODUCING RED WAVELENGTH OPTICAL RADIATION

BACKGROUND OF THE INVENTION

The present invention generally relates to light-emitting semiconductor devices and more particularly to a light-emitting semiconductor device including a laser diode that produces visible optical radiation in the wavelength band of red color.

The system of AlGaInP is a III-V material having a direct-transition type band structure and provides the bandgap of as much as about 2.3 eV (540 nm in terms of optical wavelength), which is the largest bandgap value of the III-V material system except for the system of AlGaInN or the III-V material that contains B as the group III element. Thus, AlGaInP has been a target of intensive investigation in relation to high-power light emitting diode that produces visible optical radiation of green or red color. Such a high-power light emitting diodes of green to red color wavelength band has its application in color display devices. Further, the system of AlGaInP has been studied in relation to visible-wavelength laser diode for use in laser printers or in optical recording of information, such as compact disk players or DVD players.

In the laser diode designed for producing red color wavelength radiation, it has been practiced to use a material system that achieves a lattice matching with respect to a GaAs substrate. In the art of high-density recording of information, in particular, there is a demand of a high-power laser diode that operates stably even in a high-temperature or unregulated temperature environment.

In a laser diode, laser oscillation is caused as a result of stimulated emission taking place in an active layer of the laser diode, and as a result of stimulated emission, an optical beam is produced in the active layer. In order to achieve such a laser oscillation efficiently, it is necessary to confine the carriers and further the optical radiation thus produced in the active layer effectively, and for this purpose, a cladding layer having a larger bandgap energy than the active layer is provided in such a manner that the cladding layer is disposed adjacent to the active layer.

In an ordinary laser diode having a double-heterostructure, it has been practiced to use AlGaInP containing Al for the active layer in order to reduce the wavelength of the produced optical beam to the visible wavelength band. It should be noted that Al thus added has an effect of increasing the bandgap energy of the active layer.

On the other hand, Al is a very reactive element and easily forms a deep impurity level in the active layer by reacting with oxygen, which may exist in the atmosphere used for growing the III-V epitaxial layer(s) constituting the laser diode. Further, such oxygen impurity may also be contained in the source material of the III-V crystal, although with a trace amount.

In view of the problems noted above, it is preferable to reduce the Al content in the epitaxial layer constituting the active layer of the laser diode as much as possible. Thus, there is a proposal to use a GaInP quantum well for the active layer and sandwich the foregoing GaInP active layer vertically by a pair of optical waveguide layers of AlGaInP. Such a laser structure is called SCH-QW (separate confinement heterostructure quantum well) structure. Further, in relation to the SCH-QW laser diode, there is a proposal, as in the Japanese Laid-Open Patent Publication 6-77592, to apply a strain to such a quantum well layer constituting the active layer of the laser diode so as to decrease the threshold of laser oscillation further. In the case of such a laser diode using a strained quantum well structure for the active layer, the thickness of the quantum well layer is set to be smaller than a critical thickness above which lattice relaxation takes place in the active layer by creating dislocations therein. It should be noted that such a strained quantum well layer is formed by choosing a material having a lattice constant different from that of the substrate, for the quantum well layer. In the case of the visible-wavelength laser diode that oscillates at the visible wavelength such as the wavelength of 635 nm, it is indicated, in the Japanese Laid-Open Patent Publication 6-275915, that a tensile strain is more effective than a compressive strain. In the case of a quantum well layer formed on a GaAs substrate under tensile strain, the quantum well layer can take a composition of GaInP, which is closer to the GaP composition as compared with the substrate composition of GaAs. Thereby, it should be noted that the quantum well layer has an increased bandgap energy, and a quantum well layer having a suitable thickness can be used for the strained quantum well layer. In such a construction in which a sufficient thickness is secured for the quantum well layer, the adversary effect of interface defects is successfully avoided. On the other hand, the laser diode that uses the quantum well layer under tensile strain for the active layer operates in the TM-mode, and the optical beam produced by such a laser diode has a plane of polarization which is 90° rotated as compared with the case of usual laser diode operating in the TE-mode.

As noted before, the SCH-QW construction, which uses an optical waveguide layer typically having a composition of $(Al_xGa_{1-x})_{0.5}In_{0.5}P$, successfully achieves a desired optical confinement in the optical waveguide layer. On the other hand, such an optical waveguide layer, containing a large amount of Al (x~0.5) therein, has a drawback in that a damaging is tend to be caused at the free edge surface of the laser cavity as a result of recombination of the carriers associated with the Al-induced defects contained in the optical waveguide layer. Thus, such a laser diode has a drawback in that high-power operation is difficult. Further, such a laser diode has a drawback in that the reliability is degraded substantially when operated for a long period of time.

Further, such a SCH-QW has a drawback, particularly in the case it contains a heterostructure of the AlGaInP system, in that the band offset is small in the side of the conduction band. More specifically, such a structure is characterized by a small band discontinuity ($\Delta E_c$) in the conduction band between the active layer and the cladding layer, and the carriers (electrons in particular) injected into the active layer from the cladding layer easily cause an overflow. Thereby, the laser diode shows a heavy temperature dependence in the laser threshold characteristic, particularly the threshold current, and expensive temperature regulation has been needed for stable operation thereof. This problem of poor temperature characteristic of the laser oscillation becomes rapidly worse with decreasing oscillation wavelength. For example, the temperature dependence of the laser oscillation characteristic for the laser diode operating at the wavelength of 635 nm is much worse than that of the laser diode operating at the wavelength of 650 nm.

In order to overcome the foregoing problem of temperature dependence of the laser diode, there is a proposal, as in the Japanese Laid-Open Patent Publication 4-114486, to enhance the carrier confinement efficiency by providing a multiple quantum barrier (MQB) structure between the active layer and the cladding layer, wherein the MQB structure includes a stacking of a number of extremely thin layers. This proposal, however, is turned out to be not realistic because of its structural complexity and the difficulty of thickness control of each thin layer of the MQB structure. In order to obtain the desired effect according to this conventional approach, it is necessary to form the individual layers of the MQB structure to be flat with the precision of atomic layers.

Thus, there has been a distinct limitation in the improvement of temperature dependence and further in the decrease of laser oscillation wavelength, as long as the laser diode is constructed on a conventional GaAs substrate. More specifically, it has been not possible to realize a laser diode, according to such a conventional approach, that operates at the wavelength of 635 nm in the operational environment of 80° C., with the output optical power of 30 mW or more over a long duration such as ten thousand hours or more.

In view of the foregoing problems associated with the use of the GaAs substrate, there is a proposal to construct a laser diode on a GaP substrate. A GaP substrate has a smaller lattice constant as compared with a GaAs substrate and is thought more appropriate for the substrate for growing thereon epitaxial layers of the AlGaInP system. Thus, there is a proposal in the Japanese Laid-Open Patent Publication 6-53602 of a laser diode constructed on a GaP substrate, wherein the laser diode includes a cladding layer of AlGaP having a composition of $Al_yGa_{1-y}P$ ($0 \leq y \leq 1$) and a compressed active layer of GaInP having a composition of $Ga_xIn_{1-x}P$ ($0<x<1$), which is a material having a direct-transition type band structure. In the proposed device, the active layer is doped with N forming an isoelectronic trap. This prior art device, while being able to decrease the oscillation wavelength of the laser diode and simultaneously reduce the amount of Al contained in the active layer, still has a drawback in that there remains a lattice misfit of as much as 2.3% with respect to the GaP substrate, even in the case the active layer has a composition of $Ga_{0.7}In_{0.3}P$. It should be noted that the GaInP mixed crystal maintains the direct-transition type band structure and has a lattice constant closest to the lattice constant of the GaP substrate at the foregoing composition of $Ga_{0.7}In_{0.3}P$. The existence of the foregoing lattice misfit is not preferable as such a lattice misfit reduces the critical thickness of the active layer. In order to avoid the creation of the lattice misfit dislocations in such a system, it is necessary to reduce the thickness of the active layer significantly, while the use of such an extremely small thickness for the active layer is not practical.

Further, there is a proposal in the Japanese Laid-Open Patent Publication 5-41560 in which a double heterostructure including an AlGaInP active layer and an AlGaInP cladding layer is formed on a GaAs substrate with an intervening buffer layer of GaPAs, wherein the AlGaInP layers constituting the double heterostructure have a composition of $(AlGa)_aIn_{1-a}P$ ($0.51<a \leq 0.73$) and a corresponding lattice constant intermediate to the lattice constant of GaAs and the lattice constant of GaP. The buffer layer has a composition represented as $GaP_xAs_{1-x}$ and eliminates the lattice misfit between the GaAs substrate and the double heterostructure.

FIG. 1 shows the relationship between the bandgap energy and composition in the AlGaInP system used in the foregoing prior art, wherein the continuous lines of FIG. 1 represent the composition that provides the direct-transition type band structure, while the broken lines represent the composition that provides the indirect-transition type band structure.

Referring to FIG. 1, the foregoing composition of AlGaInP ($(AlGa)_aIn_{1-a}P$; $0.51<a \leq 0.73$) having the intermediate lattice constant between GaAs and GaP falls in the region defined by the composition AlInP and the composition GaInP, wherein the AlInP composition is an intermediate composition on the line connecting the AlP composition and the InP composition. Further, the GaInP composition is an intermediate composition on the line connecting the GaP composition and the InP composition.

According to the foregoing approach of the Japanese Laid-Open Patent Publication 5-41560, it is possible to use the AlGaInP composition characterized by a lager bandgap as compared with the material system that achieves a lattice matching with the GaAs substrate for the cladding layer or active layer of the laser diode. Thus, the foregoing prior art is advantageous for realizing a laser diode operating at the visible wavelength of 600 nm or shorter. This wavelength band corresponds to green to yellow color radiation.

On the other hand, the foregoing prior art structure is not suitable for the laser diode operable at the wavelength of 635 nm or 650 nm corresponding to red color radiation. For example, it can be seen from FIG. 1 that the bandgap energy changes with lattice constant in the system of GaInP with a steeper ratio as compared with the system of AlInP up to the composition in which the Ga content is 0.73, as represented in FIG. 1 by a continuous line. Thus, when the composition of the GaInP active layer is tuned to the wavelength of 635 nm, the lattice constant of the active layer takes a value close to that of the GaAs substrate. On the other hand, it is preferable to increase the bandgap energy of the AlInP cladding layer as much as possible for effective confinement of the carriers. In order to do this, it is preferable to choose the composition close to AlP for the cladding layer. However, such a selection of the cladding layer composition invites a heavy accumulation of compressive strain in the active layer.

SUMMARY OF THE INVENTION

Accordingly, it is a general object of the present invention to provide a novel and useful light-emitting semiconductor device wherein the foregoing problems are eliminated.

Another and more specific object of the present invention is to provide a light-emitting laser diode including a laser diode operable in a high-temperature environment at the visible wavelength band of red such as 635 nm or 650 nm.

Another object of the present invention is to provide an efficient light-emitting semiconductor device, including laser diode and light-emitting diode, operable in the room temperature environment at the visible wavelength band of 600 nm or shorter.

Another object of the present invention is to provide a light-emitting semiconductor device, comprising:

a semiconductor substrate;

an active layer provided above said semiconductor substrate, said active layer producing a red optical radiation; and a cladding layer provided above said semiconductor substrate adjacent to said active layer, said active layer comprising a III-V material in the system of AlGaInPAs having a composition represented as $(Al_xGa_{1-x})_aIn_{1-a}P_tAs_{1-t}$ ($0<x<1$, $0<\alpha 1$, $0\ t\ 1$), said cladding layer containing Al and comprising a III-V material in the system of AlGaInPAs having a composition represented as $(Al_yGa_{1-y})_aIn_{1-\beta}P_VAs_{1-V}$ ($0<y\ 1$, $0.5<\beta 1$, $0<V\ 1$), said cladding layer having a bandgap larger than a bandgap of said active layer and a lattice constant intermediate between a lattice constant of GaP and a lattice constant of GaAs.

Another object of the present invention is to provide a light-emitting semiconductor device, comprising:

a semiconductor substrate;

an active layer provided above said semiconductor substrate, said active layer producing a red optical radiation;

a cladding layer provided above said semiconductor substrate adjacent to said active layer; and an optical waveguide layer interposed between said active layer and said cladding layer, said active layer comprising a single quantum well layer of a III-V material in the system of AlGaInPAs having a composition represented as $(Al_xGa_{1-x})_aIn_{1-a}P_tAs_{1-t}$ ($0 \leq x < 1$, $0 < a \leq 1$, $0 \leq t \leq 1$), said cladding layer containing Al and comprising a III-V material in the system of AlGaInPAs having a composition represented as $(Al_yGa_{1-y})_\beta In_{1-\beta}P_v As_{1-v}$ ($0 < y \leq 1$, $0.5 < \beta \leq 1$, $0 < v \leq 1$), said cladding layer having a bandgap larger than a bandgap of said active layer and a lattice constant intermediate between a lattice constant of GaP and a lattice constant of GaAs, said optical waveguide layer comprising a III-V material in the system of AlGaInPAs having a composition represented as $(Al_zGa_{1-z})_\delta In_{1-\gamma}P_uAs_{1-u}$ ($0 \leq z < 1$, $0.5 < \gamma \leq 1$, $0 < u \leq 1$), said optical waveguide layer having a bandgap larger than said bandgap of said active layer but smaller than said bandgap of said cladding layer.

Another object of the present invention is to provide a light-emitting semiconductor device, comprising:

a semiconductor substrate;

an active layer provided above said semiconductor substrate, said active layer producing a red optical radiation;

a cladding layer provided above said semiconductor substrate adjacent to said active layer; and an optical waveguide layer interposed between said active layer and said cladding layer, said active layer having a multiple quantum well structure comprising a plurality of quantum well layers of a III-V material in the system of AlGaInPAs having a composition represented as $(Al_{x1}Ga_{1-x1})_{\alpha 1}In_{1-\alpha 1}P_{t1}As_{1-t1}$ ($0 \leq x1 < 1$, $0 < \alpha 1 \leq 1$, $0 \leq t1 \leq 1$) and a plurality of barrier layers of a III-V material in the system of AlGaInPAs having a composition represented as $(Al_{x2}Ga_{1-x2})_{\alpha 2}In_{1-\alpha 2}P_{t2}As_{1-t2}$ ($0 \leq x2 < 1$, $0 < \alpha 2 < 1$, $0 \leq t2 \leq 1$), each of said barrier layers having a bandgap larger than a bandgap of said quantum well layer, said cladding layer containing Al and comprising a III-V material in the system of AlGaInPAs having a composition represented as $(Al_yGa_{1-y})_\beta In_{1-\beta}P_v As_{1-v}$ ($0 < y \leq 1$, $0.5 < \beta 1$, $0 < v \leq 1$), said cladding layer having a bandgap larger than a bandgap of said quantum well layer in said active layer and a lattice constant intermediate between a lattice constant of GaP and a lattice constant of GaAs, said optical waveguide layer comprising a III-V material in the system of AlGaInPAs having a composition represented as $(Al_zGa_{1-z})_\gamma In_{1-\gamma}P_uAs_{1-u}$ ($0 \leq z < 1$, $0.5 < \gamma \leq 1$, $0 < u \leq 1$), said optical waveguide layer having a bandgap larger than said bandgap of said quantum well layer in said active layer but smaller than said bandgap of said cladding layer.

According to the present invention, an efficient laser oscillation is obtained at the visible, red optical wavelength by using a cladding layer having a lattice constant intermediate between GaAs and GaP. It should be noted that the system of AlGaInP having such a lattice constant can provide a large bandgap effective for carrier confinement while reducing the Al-content therein. Further, the present invention enables of using an Al-free composition for the optical waveguide layers in producing a red wavelength beam. Thereby, the laser diode can be operated at a high output power without causing damage on the optical cavity edge surface. By introducing As into the cladding layer, it becomes possible to suppress the hillock formation.

Another object of the present invention is to provide a laser diode, comprising:

a semiconductor substrate; a first cladding layer of AlGaInP provided above said semiconductor substrate, said first cladding layer having a first conductivity type and a lattice constant intermediate between a lattice constant of GaAs and a lattice constant of GaP;

an active layer of GaInPAs provided above said first cladding layer;

a second cladding layer of AlGaInP provided above said active layer, said second cladding layer having second conductivity type and a lattice constant substantially identical with said lattice constant of said first cladding layer;

an etching stopper layer of GaInP provided above said second cladding layer, said etching stopper layer having said second conductivity type;

a third cladding layer of AlGaInP provided above said etching stopper layer, said third cladding layer having said second conductivity type and a lattice constant substantially identical with said lattice constant of said first cladding layer;

said etching stopper layer having a lattice constant generally equal to said lattice constant of said first cladding layer and a bandgap substantially larger than a bandgap of said active layer.

Another object of the present invention is to provide a method of fabricating a laser diode, comprising the steps of:

forming a layered structure, on a semiconductor substrate, such that said layered structure includes a first cladding layer of AlGaInP provided above said semiconductor substrate, said first cladding layer having a first conductivity type and a lattice constant intermediate between a lattice constant of GaAs and a lattice constant of GaP; an active layer of GaInPAs provided above said first cladding layer; a second cladding layer of AlGaInP provided above said active layer, said second cladding layer having a second conductivity type and a lattice constant substantially identical with said lattice constant of said first cladding layer; an etching stopper layer of GaInP provided above said second cladding layer, said etching stopper layer having said second conductivity type; a third cladding layer of AlGaInP provided above said etching stopper layer, said third cladding layer having said second conductivity type and a lattice constant substantially identical with said lattice constant of said first cladding layer; said etching stopper layer having a lattice constant generally equal to said lattice constant of said first cladding layer and a bandgap substantially larger than a bandgap of said active layer, etching said third cladding layer to form a stripe region while using said etching stopper layer as an etching stopper, until said etching stopper layer is exposed at both lateral sides of said stripe region; and filling a current confinement region on said exposed etching stopper layer at both lateral sides of said stripe region.

Another object of the present invention is to provide a method of fabricating a laser diode, comprising the steps of:

forming a layered structure, on a semiconductor substrate, such that said layered structure includes a first cladding layer of AlGaInP provided above said semiconductor substrate, said first cladding layer having a first conductivity type and a lattice constant intermediate between a lattice constant of GaAs and a lattice constant of GaP; an active layer of GaInPAs provided above said first cladding layer; a second cladding layer of AlGaInP provided above said active layer, said second cladding layer having a second conductivity type and a lattice constant substantially identical with said lattice constant of said first cladding layer; an etching stopper layer of GaInP provided above said second cladding layer, said etching stopper layer having said second conductivity type and a lattice constant generally equal to said lattice constant of said first cladding layer, said etching stopper layer having a bandgap substantially larger than a bandgap of said active layer; and a current-confinement layer provided above said etching stopper layer, said current-confinement layer having said first conductivity type;

etching said current confinement layer to form a stripe opening while using said etching stopper layer as an etching stopper, until said etching stopper layer is exposed along said stripe opening; and depositing a third cladding layer of AlGaInP having said second conductivity type on said current-confinement layer so as to fill said stripe opening.

According to the present invention, it is possible to form a current-confinement structure by a wet etching process by using an etching stopper of GaInP while avoiding unwanted optical radiation in the wavelength of red optical radiation by sun an etching stopper layer.

Another object of the present invention is to provide a light-emitting semiconductor device, comprising:

a semiconductor substrate;

a first cladding layer of n-type AlGaInP provided above said semiconductor substrate, said first cladding layer having a composition represented as $(Al_{x1}Ga_{1-x1})_{y1}In_{1-y1}P$ ($0 \leq x1$, $0.51 < y1 \leq 1$) and a lattice constant intermediate between a lattice constant of GaAs and a lattice constant of GaP;

an active layer provided above said first cladding layer;

a second cladding layer of p-type AlGaInP provided above said active layer, said second cladding layer having a composition substantially identical with said composition of said first cladding layer;

wherein a multiple quantum barrier structure is interposed between said active layer and said second cladding layer, said multiple quantum barrier structure comprising an alternate repetition of a quantum well layer having a composition represented as $(Al_{x2}Ga_{1-x2})_{y2}In_{1-y2}P$ ($0 \leq x2 \leq 1$, $0 \leq y1 \leq 1$) and a bandgap smaller than a bandgap of said second cladding layer, and a barrier layer having a composition substantially identical with said composition of said second cladding layer.

Another object of the present invention is to provide a light-emitting semiconductor device, comprising:

a semiconductor substrate;

a first cladding layer of n-type AlGaInP provided above said semiconductor substrate, said first cladding layer having a composition represented as $(Al_{x1}Ga_{1-x1})_{y1}In_{1-y1}P$ ($0 \leq x1 \leq 1$, $0.51 < y1 \leq 1$) and a lattice constant intermediate between a lattice constant of GaAs and a lattice constant of GaP;

an active layer provided above said first cladding layer;

a second cladding layer of p-type AlGaInP provided above said active layer, said second cladding layer having a composition substantially identical with said composition of said first cladding layer;

wherein a carrier blocking layer is interposed at least between said active layer and said second cladding layer, said carrier blocking layer having a composition represented as $(Al_{x3}Ga_{1-x3})_{y1}In_{1-y1}P$ ($0 \leq x1 \leq x3 \leq 1$, $0.51 < y1 \leq 1$) and a bandgap larger than a bandgap of said second cladding layer, said carrier blocking layer having a lattice constant generally matching with a lattice constant of said second cladding layer.

Another object of the present invention light-emitting semiconductor device, comprising:

a semiconductor substrate;

a first cladding layer of n-type AlGaInP provided above said semiconductor substrate, said first cladding layer having a composition represented as $(Al_{x1}Ga_{1-x1})_{y1}In_{1-y1}P$ ($0 \leq x1 \leq 1$, $0.51 < y1 \leq 1$) and a lattice constant intermediate between a lattice constant of GaAs and a lattice constant of GaP;

an active layer provided above said first cladding layer;

a second cladding layer of p-type AlGaInP provided above said active layer, said second cladding layer having a composition substantially identical with said composition of said first cladding layer;

wherein a carrier blocking layer is interposed at least between said active layer and said second cladding layer, said carrier blocking layer having a composition represented as $(Al_{x4}Ga_{1-x4})_{y4}In_{1-y4}P$ ($0$ x4 $1$, $0.51 < y1 < y4$ $1$) and a bandgap larger than a bandgap of said second cladding layer, said carrier blocking layer having a lattice constant smaller than a lattice constant of said second cladding layer.

According to the present invention, an efficient light-emitting semiconductor device producing red color radiation is obtained by using a carrier blocking layer that blocks the carriers injected into the active layer from causing over-flowing.

Other objects and further features of the present invention will become apparent from the following detailed description when red in conjunction with the attached drawings.

DETAILED DESCRIPTION OF THE INVENTION

[Principle]

First, the principle of the present invention will be explained with reference to FIGS. 2–4.

Figure 2:
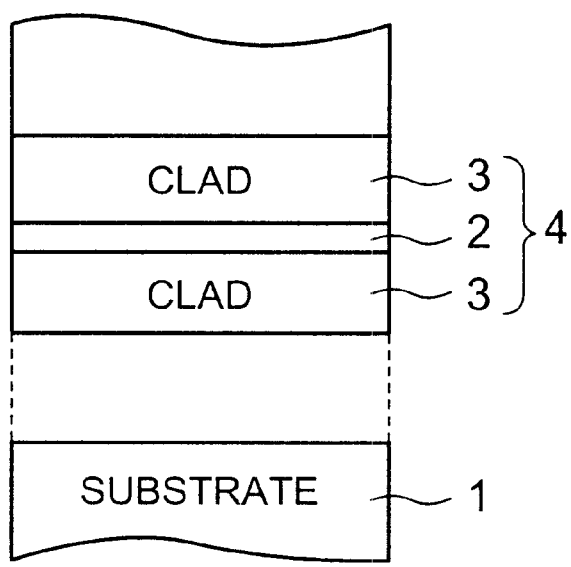
FIG. 2 is a diagram showing the principle of the present invention.
Figure 3:
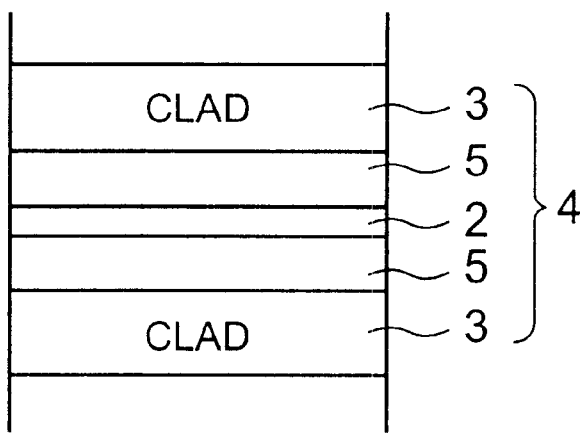
FIG. 3 is another diagram showing the principle of the present invention.

Referring to FIG. 2, the present invention provides, in a first aspect thereof, a light-emitting semiconductor device, comprising a GaAs substrate 1, an active layer 3 provided above the semiconductor substrate 1 for producing a red optical radiation, and a pair of cladding layers 3 provided above the semiconductor substrate 1 at the top side and bottom side of the active layer 2, wherein the active layer 2 is formed of a III-V material in the system of AlGaInPAs having a composition represented as $(Al_xGa_{1-x})_\alpha In_{1-\alpha}P_t As_{1-t}$ ($0\leq x<1$, $0<\alpha\leq 1$, $0\ t\leq 1$), while the cladding layers 3 contain Al and comprise a III-V material in the system of AlGaInPAs having a composition represented as $(Al_yGa_{1-y})_\beta In_{1-\beta}P_v As_{1-v}$ ($0<y\leq 1$, $0.5<\beta\leq 1$, $0<v\leq 1$). Thereby, there is formed a heterojunction region 4 in the laser diode from the active layer 2 and the top and bottom cladding layers 3. Each of the cladding layers 3 has a bandgap larger than a bandgap of said active layer 2 and a lattice constant intermediate between a lattice constant of GaP and a lattice constant of GaAs.

According to the present invention, the cladding layers 3 of AlGaInPAs having the composition of $(Al_yGa_{1-y})_\beta In_{1-\beta}P_v As_{1-v}$ ($0<y\leq 1$, $0.5<\beta\leq 1$, $0<v\leq 1$) contain Al therein and thus, the semiconductor device, which may be a laser diode, can produce a short, visible wavelength radiation with a high efficiency as compared with the case in which a III-V material achieving a lattice matching with respect to the GaAs substrate 1 is used for the cladding layer. Moreover, the use of the active layer having the composition of $(Al_xGa_{1-x})_\alpha In_{1-\alpha}P_t As_{1-t}$ ($0\leq x<1$, $0<\alpha\leq 1$, $0\leq t\leq 1$) in the present invention is advantageous for narrowing the bandgap as compared with the conventional laser diode designed for producing a green to yellow radiation at the wavelength shorter than 600 nm. Thereby, the semiconductor device of the present invention can produce a red optical radiation, longer in wavelength than 600 nm, efficiently. Further, the active layer 2 having the foregoing composition can accumulate a strain therein. This feature is also advantageous for the semiconductor device to produce a red optical radiation.

In a second aspect, the present invention provides a light-emitting semiconductor device similar to the device of the first mode except that a pair of optical waveguide layers 5 are interposed each between the active layer 2 and the top or bottom cladding layer 4 and that the active layer 2 is formed as a single quantum well layer of a III-V material in the system of AlGaInPAs having a composition represented as $(Al_xGa_{1-x})_\alpha In_{1-\alpha}P_t As_{1-t}$ ($0\leq x<1$, $0<\alpha\leq 1$, $0\leq t1$). The cladding layers 3 contain Al and are formed of a III-V material in the system of AlGaInPAs having a composition represented as $(Al_yGa_{1-y})_\beta In_{1-\beta}P_v As_{1-v}$ ($0<y\leq 1$, $0.5<\beta\leq 1$, $0<v\leq 1$), similarly as before. The cladding layers 3 have a bandgap larger than a bandgap of the active layer 2 and a lattice constant intermediate between a lattice constant of GaP and a lattice constant of GaAs. The optical waveguide layers 5 comprise a III-V material in the system of AlGaInPAs having a composition represented as $(Al_zGa_{1-z})_\gamma In_{1-\gamma}P_u As_{1-u}$ ($0\leq z<1$, $0.5<\gamma\leq 1$, $0<u\leq 1$), wherein each of the optical waveguide layers 5 has a bandgap larger than said bandgap of said active layer but smaller than the bandgap of the cladding layer 3.

According to the present invention, the cladding layers 3 of AlGaInPAs having the composition of $(Al_yGa_{1-y})_\beta In_{1-\beta}P_v As_{1-v}$ ($0<y\leq 1$, $0.5<\beta\leq 1$, $0<v\leq 1$) contain Al therein and thus, the semiconductor device, which may be a laser diode, can produce a short, visible wavelength radiation with a high efficiency as compared with the case in which a III-V material achieving a lattice matching with respect to the GaAs substrate 1 is used for the cladding layer. Moreover, due to the SCH structure formed by the active layer 2 having the composition of $(Al_xGa_{1-x})_\alpha In_{1-\alpha}P_t As_{1-t}$ ($0\leq x<1$, $0<\alpha\leq 1$, $0\leq t\leq 1$) and the top and bottom optical waveguide layers 5 having the composition of $(Al_zGa_{1-z})_\gamma In_{1-\gamma}P_u As_{1-u}$ ($0\leq z<1$, $0.5<\gamma\leq 1$, $0<u\leq 1$), a wide bandgap can be realized with a lesser amount of Al for the cladding layer 3 or the optical waveguide layer 5 as compared with the composition that achieves a lattice matching to the GaAs substrate 1. Thereby, the problem of deterioration at the edge of the cladding layer 3 or the optical waveguide layer 5 is substantially reduced and the semiconductor device can be used as a high-power laser diode. Further, it is possible to provide a strain to the active layer 2 by adjusting the composition thereof with respect to the cladding layer 3. Thereby, it is possible to tune the bandgap to the desired red optical radiation.

In the system of GaInP, it is known that the band gap becomes larger with increasing amount of Ga therein (Sandip, et al., Appl. Phys. Lett. 60, 1992, pp.630–632), while such a change of the bandgap induces a change of band discontinuity at the conduction band or at the valence band. In the case of the GaInP system, the change of band discontinuity takes place primarily on the conduction band and no substantial change occurs on the valence band. On the other hand, addition of Al to the foregoing GaInP system causes an increase of the conduction band energy and a decrease of the valence band energy, wherein the change of the valence band energy is much larger than the change of the conduction band energy.

Figures 4A, 4B:
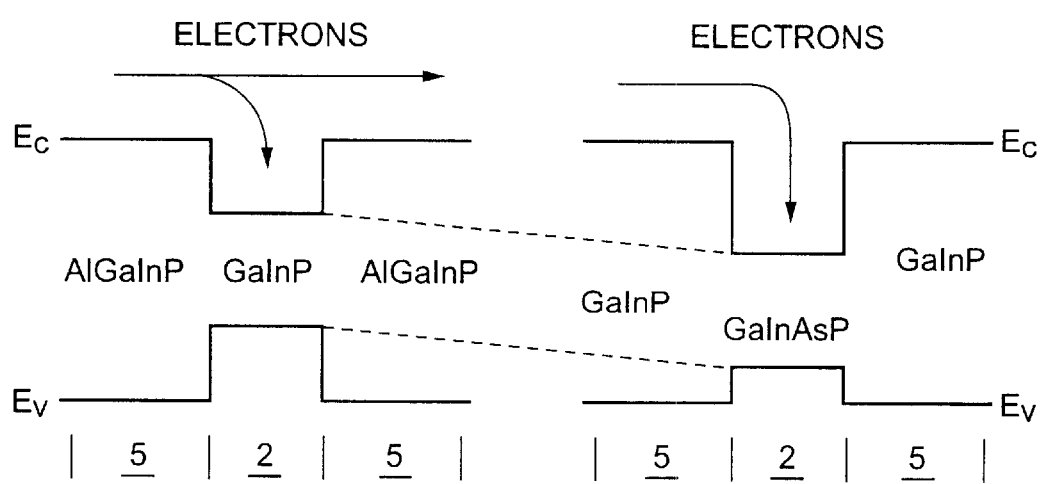
FIGS. 4A and 4B are further diagrams showing the principle of the present invention.

Conventionally, a laser diode constructed on GaAs substrate has used an optical waveguide layer of AlGaInP containing a large amount of Al. Associated with this, there has been a large band discontinuity in such a conventional layer diode between the quantum well layer of GaInP and the optical waveguide layer. On the other hand, such a conventional laser diode has suffered from the problem of insufficient band discontinuity on the conduction band, and hence the problem of poor temperature characteristic. In the laser diode of the present invention, it is possible to reduce the Al content in the optical waveguide layer while maintaining a large bandgap, and a large band discontinuity can be secured for the conduction band at the interface between the active layer 2 and the optical waveguide layer 5. Thereby, the problem of carrier (electron) overflow in the conventional red color laser diode is successfully eliminated. See FIGS. 4A and 4B comparing the band structure of the active layer according to the present invention (FIG. 4B) in comparison with a related art (FIG. 4A) that uses GaInP for the active layer 2 in combination with the optical waveguide layer 3 of AlGaInP. In the example of FIGS. 4A and 4B, it should be noted that the present invention represented in FIG. 4B uses the composition of GaInP for the optical waveguide layer 5, wherein the foregoing composition falls in the composition of $(Al_zGa_{1-z})_\gamma In_{1-\gamma} P_u As_{1-u}$ ($0 \leq z < 1$, $0.5 < \gamma \leq 1$, $0 < u \leq 1$).

Due to the increased degree of freedom of design, the laser diode of the present invention provides an improved performance not only in the wavelength band shorter than 600 nm but also in the wavelength band longer than 600 nm.

In a third aspect, the present invention provides a light-emitting semiconductor device similar to the device of the first or second aspect of the present invention explained before, wherein the active layer 2 now has a multiple quantum well structure comprising a plurality of quantum well layers of a III-V material in the system of AlGaInPAs having a composition represented as $(Al_{x1}Ga_{1-x1})_{\alpha 1} In_{1-\alpha 1} P_{t1} As_{1-t1}$ ($0 \leq x1 < 1$, $0 < \alpha 1 \leq 1$, $0 t1 \leq 1$) and a plurality of barrier layers of a III-V material in the system of AlGaInPAs having a composition represented as $(Al_{x2}Ga_{1-x2})_{\alpha 2} In_{1-\alpha 2} P_{t2} As_{1-t2}$ ($0 \leq x2 < 1$, $0 < \alpha 2 < 1$, $0 \leq t2 \leq 1$), wherein each of the barrier layers has a bandgap larger than a bandgap of said quantum well layer. The cladding layers 3 contain Al and are formed of a III-V material in the system of AlGaInPAs having a composition represented as $(Al_y Ga_{1-y})_\beta In_{1-\beta} P_v As_{1-v}$ ($0 < y \leq 1$, $0.5 < \beta \leq 1$, $0 < v \leq 1$), wherein the cladding layers 3 have a bandgap larger than a bandgap of the quantum well layer in the active layer 2 and a lattice constant intermediate between a lattice constant of GaP and a lattice constant of GaAs. The optical waveguide layer comprises a III-V material in the system of AlGaInPAs having a composition represented as $(Al_z Ga_{1-z})_\gamma In_{1-\gamma} P_u As_{1-u}$ ($0 \leq z < 1$, $0.5 < \gamma \leq 1$, $0 < u \leq 1$), wherein the optical waveguide layer 5 has a bandgap larger than the bandgap of the quantum well layer in the active layer 2 but smaller than the bandgap of said cladding layer 3.

According to the present invention, the cladding layers 3 of AlGaInPAs having the composition of $(Al_y Ga_{1-y})_\beta In_{1-\beta} P_v As_{1-v}$ ($0 < y \leq 1$, $0.5 < \beta \leq 1$, $0 < v \leq 1$) contain Al therein and thus, the semiconductor device, which may be a laser diode, can produce a short, visible wavelength radiation with a high efficiency as compared with the case in which a III-V material achieving a lattice matching with respect to the GaAs substrate 1 is used for the cladding layer. Moreover, due to the SCH structure formed by the active layer 2 having the composition of $(Al_x Ga_{1-x})_\alpha In_{1-\alpha} P_t As_{1-t}$ ($0 \leq x < 1$, $0 < \alpha \leq 1$, $0 \leq t \leq 1$) and the top and bottom optical waveguide layers 5 having the composition of $(Al_z Ga_{1-z})_\gamma In_{1-\gamma} P_u As_{1-u}$ ($0 \leq z < 1$, $0.5 < \gamma \leq 1$, $0 < u \leq 1$), a wide bandgap can be realized with a lesser amount of Al for the cladding layer 3 or the optical waveguide layer 5 as compared with the composition that achieves a lattice matching to the GaAs substrate 1. Thereby, the problem of deterioration at the edge of the cladding layer 3 or the optical waveguide layer 5 is substantially reduced and the semiconductor device can be used as a high-power laser diode. Further, it is possible to provide a strain to the quantum well layers constituting the active layer 2 by adjusting the composition thereof with respect to the cladding layer 3. Thereby, it is possible to tune the bandgap to the desired red optical radiation. For example, it is possible to apply a compressive strain to the quantum well layers and a tensile strain to the barrier layers, or vice versa.

As a result of the use of the multiple quantum well structure, it is possible to confine the carriers effectively into the quantum well layers according to the present invention. Further, a narrow bandgap material can also be used for the quantum well layers in such a multiple quantum well active layer 2.

As noted already, it is known in the system of GaInP that the band gap becomes larger with increasing amount of Ga therein (Sandip, et al., op cit.), while such a change of the bandgap induces a change of band discontinuity at the conduction band or at the valence band. In the case of the GaInP system, the change of band discontinuity takes place primarily on the conduction band and no substantial change occurs on the valence band. On the other hand, addition of Al to the foregoing GaInP system causes an increase of the conduction band energy and a decrease of the valence band energy, wherein the change of the valence band energy is much larger than the change of the conduction band energy.

Conventionally, a laser diode constructed on a GaAs substrate has used an optical waveguide layer of AlGaInP containing a large amount of Al. Associated with this, there has been a large band discontinuity in such a conventional layer diode between the quantum well layer of GaInP and the optical waveguide layer 5 of AlGaInP. On the other hand, such a conventional laser diode has suffered from the problem of insufficient band discontinuity in the conduction band, and hence the problem of poor temperature characteristic. In the laser diode of the present invention, it is possible to reduce the Al content in the optical waveguide layer 5 while maintaining a large band gap, and a large band discontinuity can be secured for the conduction band at the interface between the active layer 2 and the optical waveguide layer 5. Thereby, the problem of carrier (electron) overflow in the conventional red color laser diode is successfully eliminated. See FIG. 4 comparing the band structure of the active layer according to the present invention in comparison with a related art that uses GaInP for the active layer 2 in combination with the optical waveguide layer 3 of AlGaInP. In the example of FIG. 4, it should be noted that the present invention represented at the right uses the composition of GaInP for the optical waveguide layer 5, wherein the foregoing composition falls in the composition of $(Al_zGa_{1-z})_\gamma In_{1-\gamma}P_u As_{1-u}$ ($0 \leq z < 1$, $0.5 < \gamma \leq 1$, $0 < u \leq 1$).

Due to the increased degree of freedom of design, the laser diode of the present invention provides an improved performance not only in the wavelength band shorter than 600 nm but also in the wavelength band longer than 600 nm.

In any of the foregoing first through third aspects of the present invention, it is preferable that the active layer 2 contains As. By incorporating As into the active layer 2, the bandgap of the active layer 2 is tuned to the wavelength of red optical radiation such as 635 nm or 650 nm. Thereby, the band discontinuity in the conduction band is increased and the problem of carrier overflow is minimized. The laser diode having such an active layer selected from the AlGaIn-PAs system and containing As operates efficiently even in a unregulated temperature environment. The active layer containing As has a composition represented as $(Al_xGa_{1-x})_\alpha In_{1-\alpha}P_t As_{1-t}$ ($0 \leq x < 1$, $0 < \alpha \leq 1$, $0 \leq t < 1$).

Further, it is preferable to choose the composition of the optical waveguide layer 5 to be free from Al in any of the first through third aspects of the present invention. Even in such a case in which the optical waveguide layer is free from Al, it is possible to secure a large bandgap for the optical waveguide layer 5, provided that the optical waveguide layer 5 has a lattice constant smaller than the lattice constant of GaAs. See the band diagram of FIG. 1. For example, a band gap wavelength of 570 nm, which is normally achieved by the Al-rich composition of $(Al_{0.5}Ga_{0.5})_{0.5}In_{0.5}P$, is successfully achieved in the present invention by the Al-free optical waveguide layer 5 having a composition of $Ga_{0.7}In_{0.3}P$, wherein the GaInP having such a composition has a lattice constant between the lattice constant of GaP and the lattice constant of GaAs. Thereby, the laser diode operable at the red optical wavelength of 635 nm or 650 nm can be constructed by using Al-free III-V epitaxial layers. Due to the elimination of non-optical recombination of carriers associated with Al, the laser diode free from Al or containing smaller amount of Al according to the present invention can be used stably at a high optical output power. The optical waveguide layer 5 has an Al-free composition represented as $Ga_\gamma In_{1-\gamma}P_u As_{1-u}$ ($0.5 < \gamma \leq 1$, $0 < u \leq 1$).

Further, in any of the first through third aspects of the present invention, it is preferable that the cladding layer 3 contains As and has a composition represented as $(Al_y Ga_{1-y})_\beta In_{1-\beta}P_v As_{1-v}$ ($0 < y \leq 1$, $0.5 < \beta \leq 1$, $0 < v < 1$).

When growing a layer of AlGaInP on a (100) surface or a surface slightly inclined from the (100) surface of a GaP, GaAs, or a $GaP_{0.4}As_{0.6}$ substrate by means of an MOCVD process, it has been discovered that there occurs an extensive hillock formation on the surface of the AlGaInP crystal layer thus grown. This hillock formation is particularly significant in the case the AlGaInP layer that contains a large amount of Al, as in the case of growing an AlInP layer. Naturally, such a hillock formation decreases the yield and is not desirable in viewpoint of device fabrication process. It is believed that the droplets of Al or Ga formed during the growth of the AlGaInP layer acts as the nuclei of the hillock structure.

In the experimental investigation constituting a foundation of the present invention, the inventor of the present invention has discovered that the hillock density is drastically reduced by merely incorporating a small amount of As in to the AlGaInP layer.

Figure 5A:
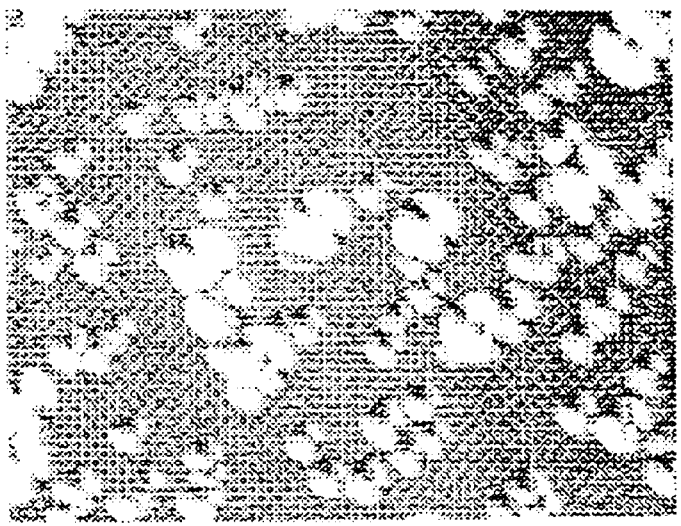
FIGS. 5A and 5B are further diagrams showing the principle of the present invention.
Figure 5B:
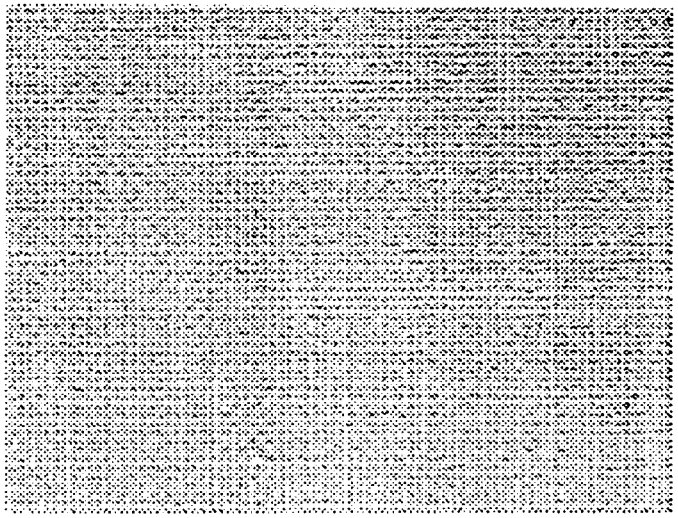

FIG. 5A shows the surface morphology of an AlInP layer grown epitaxially on a GaPAs substrate while FIG. 5B shows the surface morphology of an AlInPAs layer grown epitaxially on the same GaPAs substrate, wherein the GaPAs substrate has a composition of $GaP_{0.4}As_{0.6}$ and an inclined crystal surface offset from the (100) surface in the [110] direction by an angle of 2°, on which the growth of the AlGaInP layer or the AlGaInPAs layer was made. An MOCVD process was used and the substrate temperature was set to 750°.

Referring to FIG. 5A, it can be seen that there occurs a substantial hillock formation on the substrate, while in the case of FIG. 5B, the hillock formation is entirely eliminated by merely incorporating As into the epitaxial layer. In the experiment of FIG. 5B, the epitaxial layer contained only 10% of As.

Thus, as set forth above, it is desirable to incorporate As into the cladding layer 3 in any of the first through third aspects of the present invention for hillock-free growth of the same. As noted before, the composition of the cladding layer 3 is represented as $(Al_y Ga_{1-y})_\beta In_{1-\beta}P_v As_{1-v}$ ($0 < y \leq 1$, $0.5 < \beta \leq 1$, $0 < v < 1$).

Further, in any of the foregoing first through third aspects of the present invention, it is preferable to set the composition of the quantum well layer or the active layer 2 to have a lattice constant larger than a lattice constant of the cladding layer 3.

In the laser diode of related art constructed on a GaAs substrate for operation at the wavelength of 635 nm, a tensile strain has been used for the quantum well layer 2 in view of the very small bandgap energy of the material constituting the quantum well layer 2. In order to accumulate a compressive strain in such a system, it should be noted that a narrow gap material such as GaInP has to be used. In order to secure a sufficiently large transition energy tuned to the optical wavelength of 635 nm in such a laser diode that uses a narrow gap material for the active layer, it has been necessary to form the quantum well of the active layer 2 with an extremely small thickness so as to form quantum levels such that the quantum levels are tuned to the 635 nm radiation. This approach, however, is unrealistic because of the adversary surface effects which appears conspicuously in the system containing a very thin quantum well layer, and this is the reason why a tensile strain has been used in the active layer of the red-color laser diode of the related art. In compensation of using a tensile stress for the active layer, however, one has to suffer from the problem that the laser beam produced by such a laser diode has a polarization plane of the TM mode.

Contrary to the foregoing problematic related art, the active layer according to the present invention has a larger bandgap energy and the problem associated with the excessively small thickness of the quantum well layer is successfully avoided. Thereby, it is possible to form a quantum well layer with an optimum thickness and the laser diode can produce the optical radiation at the wavelength of 635 nm by using the active layer under the desired compressive strain. It should be noted that the laser beam produced by such a laser diode has the polarization plane corresponding to the TE mode similarly to other general purpose laser diodes. Thereby, the laser beam can be used in various applications without rotating the polarization plane and the cost of the optical element necessary for rotating the polarization plane is reduced.

In any of the foregoing first through third aspects of the present invention, it is preferable to use a GaPAs substrate for the substrate 1. In this case, therefore, the heterojunction structure 4 is formed on the GaPAs substrate. Such a GaPAs substrate can be formed by growing an epitaxial layer of GaPAs on the GaAs substrate 1 with a large thickness of typically 30 μm by a VPE process. Thereby, the composition of the GaPAs epitaxial layer is controlled such that the GaPAs epitaxial layer has a lattice constant matching with the lattice constant of the heterojunction structure 4 at the top surface thereof.

Figure 6:
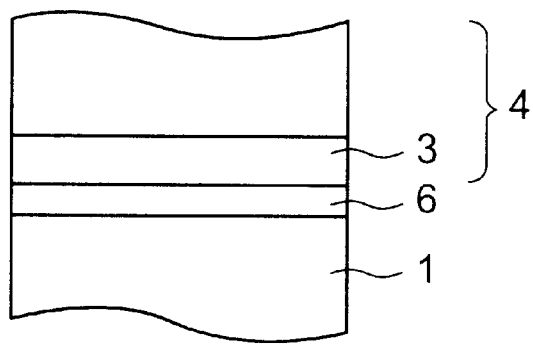
FIG. 6 is a further diagram showing the principle of the present invention.

Further, in any of the foregoing first through third aspects of the present invention, it is preferable to interpose a relaxation buffer layer 6 between the substrate 1 of GaAs (or GaP) and the cladding layer 3 as represented in FIG. 6 so as to absorb the lattice misfit existing between the substrate 1 and the cladding layer 3. According to the present invention, the heterojunction structure 4 can be formed successfully by an epitaxial process. Thereby, it is advantageous to carry out the entire epitaxial process starting from the step of forming the relaxation buffer layer 6 to the step of formation of the heterojunction structure 4 continuously in the same deposition apparatus. The relaxation buffer layer 6 may have a graded composition such that the lattice constant thereof changes gradually from the interface to the substrate 1 to the interface to the heterojunction structure 4. By changing the composition of the relaxation buffer layer 6 gradually, the lattice relaxation occurs also gradually and the problem of the dislocations in the buffer layer 6 penetrating in the upward direction to the heterojunction structure 4 is effectively eliminated. Thereby, a high crystal quality is guaranteed for the epitaxial layers constituting the heteroepitaxial structure 4. The relaxation buffer layer 6 may form a strained super lattice structure in which two epitaxial layers having respective lattice constants, such as a GaInP layer and a GaPAs layer, are stacked alternately. By using such a strained superlattice structure for the relaxation buffer layer 6, it becomes possible to confine the crystal defects associated with the lattice relaxation in the buffer layer 6. Thereby, the degradation of crystal quality of the heterojunction structure 4 is effectively eliminated.

Further, it should be noted that the relaxation buffer layer 6 may be formed as a low-temperature buffer layer grown at a temperature lower than the temperature used for growing the cladding layer 3. By doing so, it becomes possible to confine the crystal defects associated with the lattice relaxation inside the buffer layer 6, and the problem of degradation of the crystal quality of the heteroepitaxial structure 4 is effectively eliminated.

It should be noted that the foregoing material system including the alternate stacking of the GaPAs layer and the GaInP layer is particularly suitable for the relaxation buffer layer 6 in view of the ternary component system for each of the epitaxial layers. For example, a GaPAs layer can be formed on a GaP substrate by merely adding As to GaP. Similarly, the GaPAs layer can be formed on a GaAs substrate by merely adding P to GaAs. In the case of forming a GaInP layer, the growth of the GaInP layer is easily controlled, particularly at the interface of the epitaxial layers constituting the strained superlattice structure, in view of the fact that the system contains P as the only group V element having a large vapor pressure.

In any of the foregoing first through third aspects of the present invention, it should be noted that a substrate having an inclined principal surface offset from the (100) surface in the [011] direction by an offset angle in the range of 0–54.7° is preferably used for the substrate 1. Alternatively, the principal surface may be inclined in the [0-11] direction by an offset angle in the range of 10–54.7°. Further, the principal surface may be inclined in any equivalent directions. By doing so, the spontaneous formation of natural superlattice structure is suppressed, while this contributes to increase the bandgap of the epitaxial layers formed on the substrate. In other words, the use of the so-called offset substrate is useful for tuning the laser oscillation wavelength. Further, the use of the offset substrate suppresses the hillock formation. Thereby, the problem of degradation of device performance or yield of production associated with the hillock formation is successfully eliminated. In the case of fabricating an edge-emission type laser diode, the cleaving process for forming an optical cavity has to be achieved, when such an offset substrate is used, such that the cleaved surfaces defining the optical cavity are also inclined with respect to the normally used cleaved surface which is perpendicular to the (100) principal surface.

Further, in any of the first through third aspects of the present invention, it is preferable to apply a mechanical polishing process to the principal surface of the GaPAs substrate after the growth of the relaxation buffer layer 6 but before the growth of the heteroepitaxial structure 4 so as to eliminate cross-hatch patterns that are frequently formed on such a heteroepitaxial substrate as a result of the lattice misfit. It should be noted that such cross-hatch patterns can become the source of dislocations or other crystal defects in the heteroepitaxial structure 4, which is essential for the operation of the light-emitting semiconductor device.

Further, in any of the foregoing first through third aspects of the present invention, it is also possible to provide a planarization layer on the semiconductor substrate 1 such that the planarization layer is interposed between relaxation buffer layer provided on the substrate 1 and the heteroepitaxial structure 4, which includes the active layer 2 and the cladding layers 3 and may further include the optical waveguide layers 5. By providing such a planarization layer on the relaxation buffer layer, the adversary effect of the cross-hatch patterns explained above is eliminated. Such a planarization layer may be formed by depositing a GaInP layer containing Se with a concentration of $5 \times 10^{18}$ cm$^{-3}$ or more. More specifically, the inventor of the present invention has discovered that such an epitaxial layer of GaInP containing a high concentration of Se preferentially fills depressions such as the one formed by the cross-hatch pattern. Thereby, the GaInP layer thus containing Se formed a planarized top surface. Further, it should be noted that such GaInP layer containing Se with high concentration can be used also for the relaxation buffer layer 6. By using such a highly Se-doped GaInP layer for the relaxation buffer layer 6, it becomes possible to reduce the thickness of the layer 6.

In any of the foregoing first through third aspects of the present invention, it should be noted that the epitaxial layers in the heteroepitaxial structure 4 are formed by either an MOCVD process or an MBE process. On the other hand, formation of these epitaxial layers from a melt is difficult in view of large precipitation coefficient of Al from the molten phase to the solid phase. In such a case, the control of the composition of the epitaxial layers is difficult. Further, the use of a VPE process based on a halogen transport process is difficult in view of corrosive nature of the source gas AlCl, which tends to react with a quartz tube used for the deposition process. Further, the MOCVD process or MBE process may also be used for forming the relaxation buffer layer 6. In this case, the same deposition apparatus can be used for forming the relaxation buffer layer 6 and the heteroepitaxial structure 4 formed thereon.

[First Embodiments]

Figure 7:
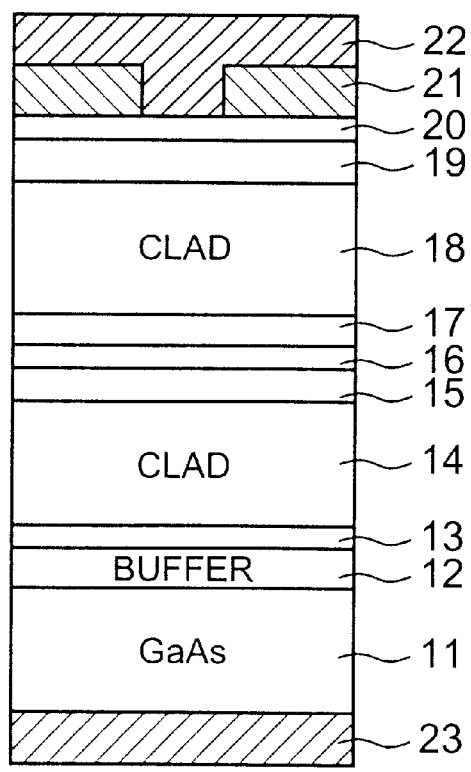
FIG. 7 is a diagram showing the structure of a laser diode according to first through seventh embodiments of the present invention.

Hereinafter, a first embodiment of the present invention will be described with reference to FIG. 7 showing the construction of a laser diode according to the first embodiment in a cross-sectional view.

Referring to FIG. 7, the laser diode has an SCH-SQW structure and is constructed on an offset GaAs substrate 11 having a principal surface inclined from the (100) surface in the [011] direction by an offset angle of 15°. Thus, a graded buffer layer 12 of n-type GaInP is formed on the substrate 11 by an MOCVD process with a thickness of about 2 µm while changing the composition of Ga from 0.5 to 0.7. The graded buffer layer 12 contains Se with a concentration level of $5 \times 10^{18}$ cm$^{-3}$ or more and provides a lattice relaxation. Further, in order to ensure the planarization, a further planarization layer 13 of n-type GaInP having a uniform composition of $Ga_{0.7}In_{0.3}P$ is formed on the graded buffer layer 12 with a thickness of about 1 µm. Thereby, any cross-hatch patterns that may be formed on the surface of the graded buffer layer 12 are filled with the planarization layer 13 and a planarized surface is obtained at the top surface of the layer 13.

According to the experiments conducted by the inventor, it was discovered that a GaInP layer doped with Se to a high concentration level (preferably larger than about $5 \times 10^{18}$ cm$^{-3}$) fills the depressions formed on the graded buffer layer 12 preferentially and that the GaInP layer 13 thus formed provides an excellent planarized surface, which is even more flat than the top surface of the GaAs substrate 11. Thereby, the thickness of the planarization layer 13 can be reduced to 1 µm as a result of high-concentration doping of Se also into the graded buffer layer 12.

Next, on the planarization layer 13 thus formed, a bottom cladding layer 14 of n-type AlInP having a composition represented as $(Al_yGa_{1-y})_\beta In_{1-\beta}P_vAs_{1-v}$ (y=1, β=0.7, v=1) is formed epitaxially with a thickness of about 1 µm, and a bottom optical waveguide layer 15 of undoped AlGaInP having a composition represented as $(Al_zGa_{1-z})_\gamma In_{1-\gamma}P_uAs_{1-u}$ (z=0.1, γ=0.7, u=1) is formed epitaxially on the bottom cladding layer 14 with a thickness of 0.1 µm. It should be noted that the foregoing bottom cladding layer 14 and the bottom optical waveguide layer 15 have a composition that achieves a lattice matching with the GaInP layer 13 having the foregoing composition of $Ga_{0.7}In_{0.3}P$.

On the optical waveguide layer 15, there is provided a SQW layer 16 of undoped GaInP having a composition represented as $(Al_xGa_{1-x})_\alpha In_{1-\alpha}P_tAs_{1-t}$ (x=0, α=0.6, t=1) as the active layer of the laser diode, wherein the SQW layer 16 is formed epitaxially with a thickness of about 8 nm. It should be noted that the SQW layer 16 having such a composition accumulates therein a compressive strain.

Further, a top optical waveguide layer 17 of undoped AlGaInP having a composition represented as $(Al_zGa_{1-z})_\gamma In_{1-\gamma}P_uAs_{1-u}$ (z=0.1, γ=0.7, u=1) is formed on the active layer 16 epitaxially with a thickness of about 0.1 µm, and a top cladding layer 18 of p-type AlInP having a composition represented as $(Al_yGa_{1-y})_\beta In_{1-\beta}P_vAs_{1-v}$ (y=1, β=0.7, v=1) is formed epitaxially on the optical waveguide layer 17 with a thickness of about 1 µm. Further, a cap layer 19 of p-type GaInP having a composition of $Ga_{0.7}In_{0.3}P$ is formed epitaxially on the top cladding layer 18 with a thickness of about 0.1 µm, and a contact layer 20 of p-type GaAs is formed further thereon epitaxially with a thickness of about 0.005 µm. The cladding layers 14 and 18 and the optical waveguide layers 15 and 17 have a composition set so as to achieve a lattice matching with the planarization layer 14 of GaInP, as noted before.

On the contact layer 20, there is provided an insulating layer 21 Of $SiO_2$ and a p-type ohmic electrode 22 is provided on the insulating layer 21 so as to make an ohmic contact with the contact layer 20 at an opening formed in the insulating layer 21. Further, an n-type ohmic electrode 23 is formed on a bottom surface of the GaAs substrate 11. Thereby, the laser diode forms a stripe laser diode. Of course, the construction of FIG. 7 can be modified to form other type of laser diode such as a ridge-guide type laser diode.

According to the present embodiment, the cladding layers 14 and 18 or the optical waveguide layers 15 and 17 have a bandgap larger than the bandgap of the conventional material system that achieves a lattice matching with GaAs. Because of this feature of increased bandgap associated with the strained system, it became possible to realize a laser diode operating at the wavelength of 595 nm, which is shorter than the wavelength of 600 nm, while reducing the Al content in the optical waveguide layers 15 and 17 as compared with the optical waveguide layers conventionally used for forming a laser diode operable at the wavelength of 635 nm on a GaAs substrate. Because of the reduced Al content in the optical waveguide layers 15 and 17, the laser diode of the present embodiment successfully reduces the non-optical recombination of carriers and the efficiency of laser oscillation is improved. Further, associated with the reduction of the Al content, the laser diode of the present invention reduces the surface recombination current associated with Al, and the laser diode can be operated stably at a high output power without inducing a damaging at the edge surface.

In the present embodiment, it should further be noted that the quantum well layer 16 uses GaInP. As the lattice constant of GaInP increases with decreasing Ga content, and in view of the fact that the change of the bandgap occurs mainly on the conduction band, not on the valence band when the Ga content is changed (Sandip, et a., op. cit.), the present invention enables to secure a large band discontinuity on the conduction band at the interface between the optical waveguide layer 15 or 17 and the quantum well layer 16 while simultaneously reducing the Al content in the optical waveguide layer 15 or 17.

In the case of a conventional visible or red laser diode constructed on a GaAs substrate, it has been necessary to use AlGaInP containing a large amount of Al for the optical waveguide layers 15 and 17 in order to secure a sufficient band discontinuity at the interface between the quantum well layer 16 and the optical waveguide layer 15 or 17 and have suffered from various problems associated with Al contained in the optical waveguide layers.

Thus, the present invention successfully eliminates the problem associated with the use of Al in the optical waveguide layers 15 and 17 while simultaneously securing a large band discontinuity a the interface between the quantum well layer 16 and the optical waveguide layer 15 or 17. Thereby, the laser diode of the present embodiment provides an excellent temperature stability.

In the present embodiment, the cladding layers 14 and 18 are required to have a bandgap larger than the bandgap of the active layer 16 and may have a composition represented as $(Al_yGa_{1-y})_\beta In_{1-\beta}P_vAs_{1-v}$ (0<y≦1, 0.5<β<1, 0<v≦1). Further, the optical waveguide layers 15 and 17 are required to have a bandgap smaller than the bandgap of the cladding layers 14 and 18 but larger than the bandgap of the active layer 16. The optical waveguide layers 15 and 17 are further required to have a lattice constant coincident to the lattice constant of the cladding layers 14 and 18. Within this limitation, the composition of the optical waveguide layers 15 and 17 can be chosen from the composition of $(Al_zGa_{1-z})_\gamma In_{1-\gamma}P_uAs_{1-u}$ (0≦z<1, 0.5<γ<1, 0<u 1). Further, an MQW structure may be used for the active layer 16. The compositional parameter β of the cladding layer 14 or 18 influences the lattice constant of the cladding layer, wherein the parameter β is set so that a lattice matching is achieved between the cladding layer 14 or 18 and the planarization layer 13 formed at the top part of the relaxation buffer layer 12.

In the laser diode of the present embodiment, the principal surface of the GaAs substrate 11 may offset in the [011] direction from the (100) surface with an offset angle within the range of 0 to 54.7 or in the [0–11] direction with an offset angle within the range of 0 to 54.7° for suppressing the spontaneous formation of natural superlattice structure. As a result of the elimination of the formation of natural superlattice structure, narrowing of the bandgap is eliminated and the construction is suitable for decreasing the laser oscillation wavelength. Further, the use of the inclined principal substrate surface is advantageous for reducing the hillock density. Thereby, the problem of deterioration of the laser diode performance or yield of production is effectively avoided.

In the case of the edge-emission type laser diode as in the example of FIG. 7, an efficient optical cavity is formed by cleaving the substrate with an inclined angle with respect to the normal cleavage surface, which is perpendicular to the (100) surface, in correspondence to the offset angle of the inclined principal surface.

In the present embodiment, the entire epitaxial layers including the layers 12–20 are grown by an MOCVD process in the same deposition chamber by continuing the growth process consecutively and continuously. Thereby, the fabrication cost of the semiconductor device is reduced significantly. Alternatively, the epitaxial layers may also be formed by an MBE process.

It should be noted that the foregoing structure of FIG. 7 is also applicable to a light-emitting diode.

[Second Embodiment]

Next, a second embodiment of the laser diode according to the present invention will be described again with reference to FIG. 7, wherein the laser diode of the second embodiment is tuned to the red optical radiation at the wavelength of 635 nm or 650 nm.

In the present embodiment, the laser diode has a structure substantially identical with the structure of FIG. 7 and the structural description thereof will be omitted.

In the present embodiment, a material in the system of GaInPAs containing non-infinitesimal amount of As is used for the SQW layer constituting the active layer 16 for tuning the oscillation wavelength of the laser diode to red color radiation of the foregoing wavelengths.

More specifically, the GaAs substrate 11 has an inclined principal surface offset in the [011] direction from the (100) surface by an offset angle of 15°. Further, the graded buffer layer 12 of Se-doped GaInP and the planarization layer 13 of Se-doped GaInP are formed on the substrate 11 similarly to the previous embodiment, wherein the GaInP planarization layer 13 has a composition of $Ga_{0.7}In_{0.3}P$. Similarly as before, the GaInP layers 12 and 13 are doped with Se to the concentration level of $5×10^{18} cm^{-3}$.

In the present embodiment, the cladding layers 14 and 18 are formed respectively of n-type and p-type AlInP both having the composition represented as $(Al_yGa_{1-y})_\beta In_{1-\beta}P_vAs_{1-v}$ (y=1, β=0.7, v=1), wherein the layers 14 and 18 are formed to have a thickness of about 1 μm, similarly to the previous embodiment. Further, the optical waveguide layers 15 and 17 are formed respectively of undoped AlGaInP both having the composition represented as $(Al_zGa_{1-z})_\gamma In_{1-\gamma}P_uAs_{1-u}$ (z=0.1, γ=0.7, u=1), wherein the layers 15 and 17 are formed to have a thickness of about 0.1 μm. On the other hand, the active layer 16 is formed on an undoped GaInPAs having a composition represented as $(Al_xGa_{1-x})_\alpha In_{1-\alpha}P_tAs_{1-t}$ (x=0, α=0.6, t=0.9), wherein it can be seen that the active layer 16 now contains an effective amount of As. Similarly as before, the active layer 16 may have a thickness of about 8 nm. Otherwise, the laser diode of the present invention is identical with the laser diode of the previous embodiment.

In the foregoing construction of the second embodiment, it should be noted that the cladding layers 14 and 18 of the optical waveguide layers 15 and 17 have a composition that achieves a lattice matching with the planarization layer 13 of GaInP on the top part of the relaxation buffer layer 12.

According to the present embodiment, the laser diode successfully operates at the wavelength of 635 nm as a result of the use of the As-containing composition for the active layer 16. Further, the active layer 16 of GaInPAs thus containing As has a composition that accumulates therein a compressive strain when formed on the GaInP layer 13 in the structure of FIG. 7. It should be noted that the a compressive strain exceeding 1% would be needed in the active layer 16 when the active layer 16 is formed of GaInP free from Al and when the foregoing laser oscillation wavelength of 635 nm is to be achieved by the compressive strain alone. As a result of addition of As, the bandgap of the active layer 16 constituting the SQW structure is increased and the laser oscillation wavelength is tuned to 635 nm. Further, the laser diode of the present embodiment is advantageous in the practical view point in that the laser diode operates in the TE-mode, like many other laser diodes. Thereby, no optical fixture is needed for rotating the polarization place of the optical beam produced by the laser diode operating in the TM-mode.

Further, it is also possible to use a strained quantum well layer accumulating therein a tensile strain for the active layer 16, as long as the material constituting the quantum well layer has a direct-transition band structure. In this case, it is preferable to choose the composition of the cladding layers 14 and 18 such that the cladding layers 14 and 18 have a lattice constant larger than the lattice constant of the previous embodiment. Thereby, the bandgap of the cladding layers 14 and 18 or the bandgap of the optical waveguide layers 15 and 17 becomes larger as compared with the conventional composition that achieves a lattice matching with the GaAs substrate 11, and the band discontinuity at the heteroepitaxial interface is increased and the efficiency of carrier confinement is improved. Further, as a result of use of the tensile strain in the cladding layers 14 and 18, it is possible to use a widegap material for the quantum well layer 16 and the quantum well layer 16 is allowed to have a larger thickness as compared with the conventional case of using the cladding layers 14 and 18 that achieve a lattice matching with the GaAs substrate 11. Further, the Al content z in the optical waveguide layers 15 and 17 can be reduced to 0.07, and the problem of non-optical recombination of carriers in the laser diode is substantially reduced. As a result, the efficiency of laser oscillation is improved and the high-power operation of the laser diode is improved also.

For the cladding layers 14 and 18, an Al-containing composition providing a large bandgap represented as $(Al_yGa_{1-y})_{62} In_{1-\beta}P_vAs_{1-v}$ (0<y≦1, 0.5<β<1, 0<v≦1) may be used. As to the optical waveguide layers 15 and 17, a composition represented as $(Al_zGa_{1-z})_\gamma In_{1-\gamma}P_uAs_{1-u}$ (0≦z<1, 0.5<γ<1, 0<u≦1) may be used, as long as the optical waveguide has a bandgap larger than the bandgap of the active layer 16 but smaller than the bandgap of the cladding layers 14 and 18 and as long as the lattice constant of the optical waveguide layer 15 or 17 is similar to that of the cladding layers 14 and 18.

Similarly to the previous embodiment, the laser diode of the present embodiment also may have an MQW structure for the active layer 16. The compositional parameter β of the cladding layers 14 and 18 are adjusted so that the cladding layer achieves a lattice matching with the uppermost layer 13 of the relaxation buffer layer 12. As noted previously, the principal surface of the GaAs substrate 11 may be tilted from the (100) surface in the [011] direction within the angle of 0–54.7° or in the [0-11] direction within the angle of 10–54.7° for suppressing the spontaneous formation of the natural superlattice structure. By doing to, the problem of unwanted decrease of the bandgap, associated with the natural superlattice formation, is avoided. The epitaxial layers in the structure of FIG. 7 may be formed by any of MOCVD process of MBE process.

[Third Embodiment]

Next, a third embodiment of the present invention will be described again with reference to FIG. 7.

In the present embodiment, the laser diode has a structure similar to that of FIG. 7 explained already, except that the relaxation buffer layer 12 is formed of a graded layer of n-type GaPAs in place of the GaInP layer, wherein the content of P is changed gradually in the buffer layer 2 from 0 at the interface to the substrate 11 to 0.4 at the interface to the planarization layer 13. The buffer layer 12 is doped with Se and is formed with a thickness of about 2 μm. Further, the planarization layer 13 is now formed of Se-doped n-type $GaP_{0.4}As_{0.6}$ in place of GaInP, wherein the planarization layer 13 is formed on the relaxation buffer layer 12 with a thickness of about 1 μm.

[Fourth Embodiment]

Next, a fourth embodiment of the present invention will be described again with reference to FIG. 7 and further with reference to FIG. 8, wherein those parts corresponding to the parts described previously are designated by the same reference numerals and the description thereof will be omitted.

Figure 8:
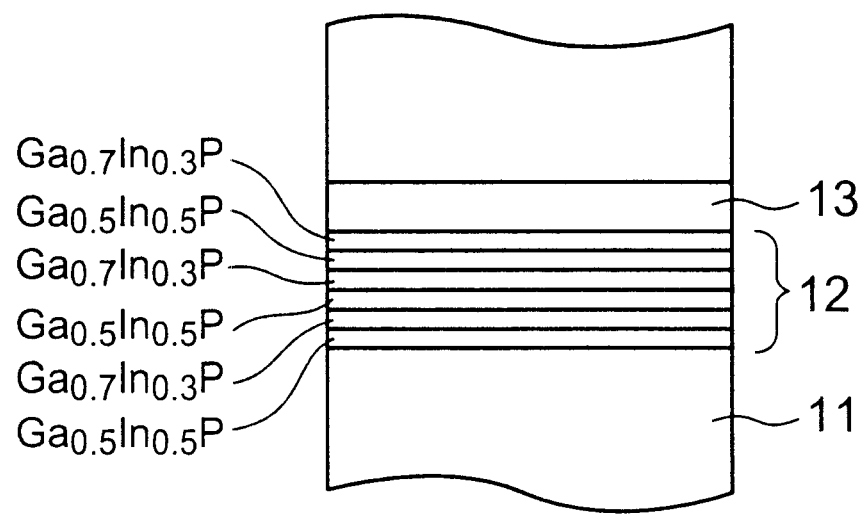
FIG. 8 is a diagram showing the laser diode of the fourth embodiment in an enlarged scale.

Referring to FIG. 8, it can be seen that the relaxation buffer layer 12 is now formed of a strained superlattice structure including an alternate stacking of a first GaInP layer having a composition of $Ga_{0.7}In_{0.3}P$ and a second GaInP layer having a composition of $Ga_{0.5}In_{0.5}P$, wherein the first GaInP layer achieves a lattice matching with the cladding layer 14, while the second GaInP layer achieves a lattice matching with the GaAs substrate 11. Each of the first and second GaInP layers is doped with Se to a concentration level of $5\times10^{18}$ cm$^{-2}$, wherein the first and second GaInP layers are repeated alternately until the total thickness of the relaxation buffer layer 12 becomes about 2 μm.

[Fifth Embodiment]

Next, a fifth embodiment of the present invention will be described again with reference to FIG. 7.

In the present embodiment, the relaxation buffer layer 12 of n-type GaPAs is formed on the foregoing inclined principal surface of the GaAs substrate 11 with a composition of $GaP_{0.4}As_{0.6}$ by an MOCVD process conducted at a temperature lower than the temperature used for growing the cladding layer 14. In the present embodiment, the foregoing low-temperature buffer layer 12 of GaPAs is formed with a thickness of about 0.1 μm, and the planarization layer 13 of n-type GaInP doped with Se to the concentration level of $5\times10^{18}$ cm$^{-3}$ and having the composition of $Ga_{0.7}In_{0.3}P$ is formed with a thickness of about 2 μm.

Otherwise, the laser diode of the present embodiment is more or less the same as the laser diode of previous embodiment and further description thereof will be omitted.

[Sixth Embodiment]

Figure 9:
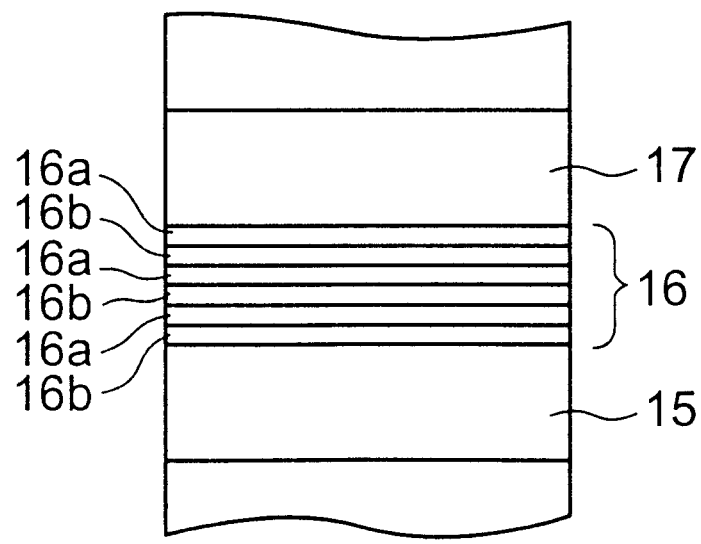
FIG. 9 is a diagram showing the laser diode of the sixth and seventh embodiments in an enlarged scale.

Next, a sixth embodiment of the laser diode according to the present invention will be described again with reference to FIG. 7 and further with reference to FIG. 9, wherein the laser diode of the second embodiment is tuned to the red optical radiation at the wavelength of 635 nm or 650 nm. In FIG. 9, those parts corresponding to the parts described previously are designated by the same reference numerals and the description thereof will be omitted.

In the present embodiment, the laser diode has a structure substantially identical with the structure of FIG. 7 and the structural description thereof will be omitted.

In the present embodiment, an MQW structure is used for the active layer 16.

More specifically, the GaAs substrate 11 has an inclined principal surface offset in the [011] direction from the (100) surface by an offset angle of 15°. Further, the graded buffer layer 12 of Se-doped GaInP and the planarization layer 13 of Se-doped GaInP are formed on the substrate 11 similarly to the previous embodiment, wherein the GaInP planarization layer 13 has a composition of $Ga_{0.7}In_{0.3}P$. Similarly as before, the GaInP layers 12 and 13 are doped with Se to the concentration level of $5\times10^{18}$ cm$^{-3}$.

In the present embodiment, the cladding layers 14 and 18 are formed respectively of n-type and p-type AlGaInP both having the composition represented as $(Al_yGa_{1-y})_\beta In_{1-\beta} P_vAs_{1-v}$ (y=0.7, β=0.7, v=1), wherein the layers 14 and 18 are formed to have a thickness of about 1 μm. Further, the optical waveguide layers 15 and 17 are formed respectively of undoped GaInP both having the Al-free composition represented as $(Al_zGa_{1-z})_\gamma In_{1-\gamma} P_uAs_{1-u}$ (z=0, γ=0.7, u=1), wherein the layers 15 and 17 are formed to have a thickness of about 0.1 μm. On the other hand, the active layer 16 has an MQW structure represented in FIG. 9 wherein a number of undoped GaPAs quantum well layers 16a each having a thickness of 8 nm and a composition represented as $(Al_xGa_{1-x})_\alpha In_{1-\alpha} P_tAs_{1-t}$ (x=0, α=1, t=0.3) and a number of undoped Al-free barrier layers 16b of GaInP each having a thickness of 10 nm and a composition represented as $(Al_zGa_{1-z})_\gamma In_{1-\gamma} P_uAs_{1-u}$ (z=0, γ=0.7, u=1) are stacked alternately and repeatedly. Otherwise, the laser diode of the present invention is identical with the laser diode of the previous embodiment. The quantum well layers 16a in such a construction accumulates therein a compressive strain.

In the present embodiment, which uses the foregoing compositions for the cladding layers 14 and 18, it is necessary to induce a substantial strain in the quantum well layers 16a in order to achieve a laser oscillation at the wavelength of 650 nm, even in such a case GaInP, which is the material that provides the smallest bandgap in the AlGaInP family, is used for the quantum well layer 16a. In order to avoid the degradation of quality of the crystal constituting the quantum well layer 16a, the quantum well layer 16a of the present embodiment is added with As so as to tune the bandgap thereof to the desired wavelength without using excessive strain. As noted already, the bandgap of GaInP decreases with decreasing Ga content. In view of Sandip op cit., such a change of bandgap occurs mainly on the conduction band. No substantial change occurs on the valence band. Thus, in the heteroepitaxial system formed of an optical waveguide layer of Al-free GaInP and a compressed quantum well layer of GaInP, the band discontinuity appears mostly on the conduction band. Thereby, the problem of carrier (electron) overflow, which has been a problem in a red laser diode formed of the AlGaInP material system, on the conduction band is effectively eliminated. While such a structure may raise a concern about the hole confinement on the valence band, the incorporation of As into the GaInP system causes a change of band structure mainly on the valence band, and the system that uses the GaInPAs quantum well layer 16a in combination with the optical waveguide layer or cladding layer of GaInP realizes an effective carrier confinement into the quantum well layer 16a, in which the desired stimulated emission takes place.

The laser diode of the present embodiment oscillates at the wavelength of 650 nm and produces a polarized beam having the TE-mode. The efficiency of carrier confinement is improved over the case in which a material system that achieves a lattice matching to the GaAs substrate is used, due to the increased bandgap of the cladding layers 14 and 18 or the optical waveguide layers 15 and 17. Further, the MQW structure used in the present embodiment contributes to increase the carrier confinement into the quantum well layers 16a further. As a result of the use of compressive strain in the quantum well layers 16a, the present embodiment allows the use of a widegap material for the quantum well layers when tuning the oscillation wavelength of the laser diode to the desired red optical wavelength. Thereby, the thickness of the quantum well layers 16a can be increased as compared with the case in which a material system that achieves a matching to the GaAs substrate 1 is used for the cladding layer 14 or 18, and the adversary effect of the surface is reduced. As the quantum well layers 16a, the barrier layers 16b and the optical waveguide layers 15 and 17 are free from Al, the problem of non-optical recombination of carriers and associated problem of decrease of the efficiency of laser oscillation is also eliminated. Further, the problem of damaging at the free edge surface of the laser cavity caused by Al contained in the optical waveguide layers 15 and 17 or in the active layer 16 is eliminated and the laser diode can be operated stably at a high output power.

In the present embodiment, the cladding layers 14 and 18 may also have an Al-containing composition represented as $(Al_yGa_{1-y})_\beta In_{1-\beta}P_vAs_{1-v}$ ($0<y\leq 1$, $0.5<\beta<1$, $0<v\leq 1$) provided that the cladding layers have a bandgap energy larger than the bandgap energy of the active layer 16. The cladding layers 14 and 18 change the lattice constant when the compositional parameter $\beta$ is changed, wherein the compositional parameter $\beta$ is adjusted so that the cladding layer 14 has a lattice constant matching with the lattice constant of planarization layer 13 or the top part of the relaxation buffer layer 12. Further, the barrier layers 16b may have a composition so as to accumulate strain therein. For example, the barrier layers 16b maybe formed so as to accumulate strain opposite to the strain accumulated in the quantum well layers 16a. This construction is useful for compensating for the strain of the quantum well layers 16a particularly in the case the strain accumulated in the quantum well layers 16 is excessively large.

Otherwise, the present embodiment is similar to those described previously.

[Seventh Embodiment]

Next, a seventh embodiment of the present invention will be described again with reference to FIGS. 7 and 9, wherein the present embodiment provides a laser diode operable at the wavelength of red optical radiation such as 635 nm or 650 nm while using Al-free optical waveguide layers.

In the present embodiment, an offset GaP substrate is used in place of the GaAs substrate 1, wherein the offset GaP substrate 1 has an inclined principal surface inclined by an offset angle of 15° from the (100) direction in the [011] direction. On the inclined principal surface of the GaP substrate 1, there is provided a graded buffer layer of n-type GaInP in place of the buffer layer 12 by an MOCVD process while changing the Ga content from 1 to 0.78. The graded buffer layer 12 of GaInP is doped with Se to a concentration level of $5\times 10^{18}$ cm$^{-3}$ or more and is formed with a thickness of about 2 μm. Further, a planarization layer of n-type GaInP is formed in correspondence to the planarization layer 13 with a thickness of about 1 μm, wherein the planarization layer 13 has a composition of $Ga_{0.78}In_{0.22}P$ and is doped with Se to a concentration level of $5\times 10^{18}$ cm$^{-3}$ or more. By doping the planarization layer 13 with Se to a high concentration level, the planarization layer 13 fills any cross-hatch depressions formed on the top surface of the buffer layer 12 and provides a planarized top surface. It should be noted that the planarized top surface of the layer 13 has a superior flatness as compared with the top surface of the GaP substrate 11. Thus, the use of the planarization layer 13 is quite effective for eliminating the defect formation in the epitaxial layers grown on the substrate 11.

On the planarization layer 13, there are formed upper and lower cladding layers respectively of n-type and p-type AlGaInP corresponding to the cladding layers 14 and 18 explained previously, wherein both of the cladding layers 14 and 18 thus formed have the composition represented as $(Al_yGa_{1-y})_\beta In_{1-\beta}P_vAs_{1-v}$ ($y=0.7$, $\beta=0.78$, $v=1$) and have a thickness of about 1 im. Further, optical waveguide layers corresponding to the optical waveguide layers 15 and 17 are formed so as to having an Al-free composition represented as $(Al_zGa_{1-z})_\gamma In_{1-\gamma}P_uAs_{1-u}$ ($z=0$, $\gamma=0.78$, $u=1$), wherein the optical waveguide layers 15 and 17 thus formed have a thickness of about 0.1 μm. Further, an active layer corresponding to the active layer 16 is formed between the upper and lower optical waveguide layers 15 and 17, wherein the active layer 16 of the present embodiment has an MQW structure similar to the one represented in FIG. 9 wherein three undoped GaPAs quantum well layers 16a each having a thickness of 8 nm and a composition represented as $(Al_xGa_{1-x})_\alpha In_{1-\alpha}P_tAs_{1-t}$ ($x=0$, $\alpha=1$, $t=0.3$) and three undoped Al-free barrier layers 16b of GaInP each having a thickness of 10 nm and a composition represented as $(Al_zGa_{1-z})_\gamma In_{1-\gamma}P_uAs_{1-u}$ ($z=0$, $\gamma=0.78$, $u=1$) are stacked alternately. Otherwise, the laser diode of the present invention is identical with the laser diode of the previous embodiment. The quantum well layers 16a in such a construction accumulates therein a compressive strain.

In the present embodiment, which uses the foregoing compositions for the cladding layers 14 and 18, it is necessary to induce a substantial strain in the quantum well layers 16a in order to achieve a laser oscillation at the wavelength of 635 nm, even in such a case GaInP, which is the material that provides the smallest bandgap in the AlGaInP family, is used for the quantum well layer 16a. In order to avoid the degradation of quality of the crystal constituting the quantum well layer 16a, the quantum well layer 16a of the present embodiment is added with As so as to tune the bandgap thereof to the desired wavelength without using excessive strain.

The laser diode of the present embodiment oscillates at the wavelength of 650 nm and produces a polarized beam having the TE-mode. The efficiency of carrier confinement is improved over the case in which a material system that achieves a lattice matching to the GaAs substrate is used, due to the increased bandgap of the cladding layers 14 and 18 or the optical waveguide layers 15 and 17. Further, the MQW structure used in the present embodiment contributes to increase the carrier confinement into the quantum well layers 16a further. As a result of the use of compressive strain in the quantum well layers 16a, the present embodiment allows the use of a widegap material for the quantum well layers when tuning the oscillation wavelength of the laser diode to the desired red optical wavelength. Thereby, the thickness of the quantum well layers 16a can be increased as compared with the case in which a material system that achieves a matching to the GaAs substrate 1 is used for the cladding layer 14 or 18, and the adversary effect of the interface is reduced. As the quantum well layers 16a, barrier layers 16b or the optical waveguide layers 15 and 17 are free from Al, the problem of non-optical recombination of carriers and associated problem of decrease of the efficiency of laser oscillation is also eliminated. Further, the problem of damaging at the free edge surface of the laser cavity caused by Al contained in the optical waveguide layers 15 and 17 or in the active layer 16 is eliminated and the laser diode can be operated stably at a high output power.

In the present embodiment, the cladding layers 14 and 18 may also have an Al-containing composition represented as $(Al_yGa_{1-y})_\beta In_{1-\beta}P_vAs_{1-v}$ ($0<y\leq 1$, $0.5<\beta<1$, $0<v\leq 1$), provided that the cladding layers have a bandgap energy larger than the bandgap energy of the active layer 16. The cladding layers 14 and 18 change the lattice constant when the compositional parameter $\beta$ is changed, wherein the compositional parameter $\beta$ is adjusted so that the cladding layer 14 has a lattice constant matching with the lattice constant of planarization layer 13 or the top part of the relaxation buffer layer 12. Further, the barrier layers 16b may have a composition so as to accumulate strain therein. For example, the barrier layers 16b may be formed so as to accumulate strain opposite to the strain accumulated in the quantum well layers 16a. This construction is useful for compensating for the strain of the quantum well layers 16a particularly in the case the strain accumulated in the quantum well layers 16 is excessively large.

Otherwise, the present embodiment is similar to those described previously.

[Eighth Embodiment]

Figure 10:
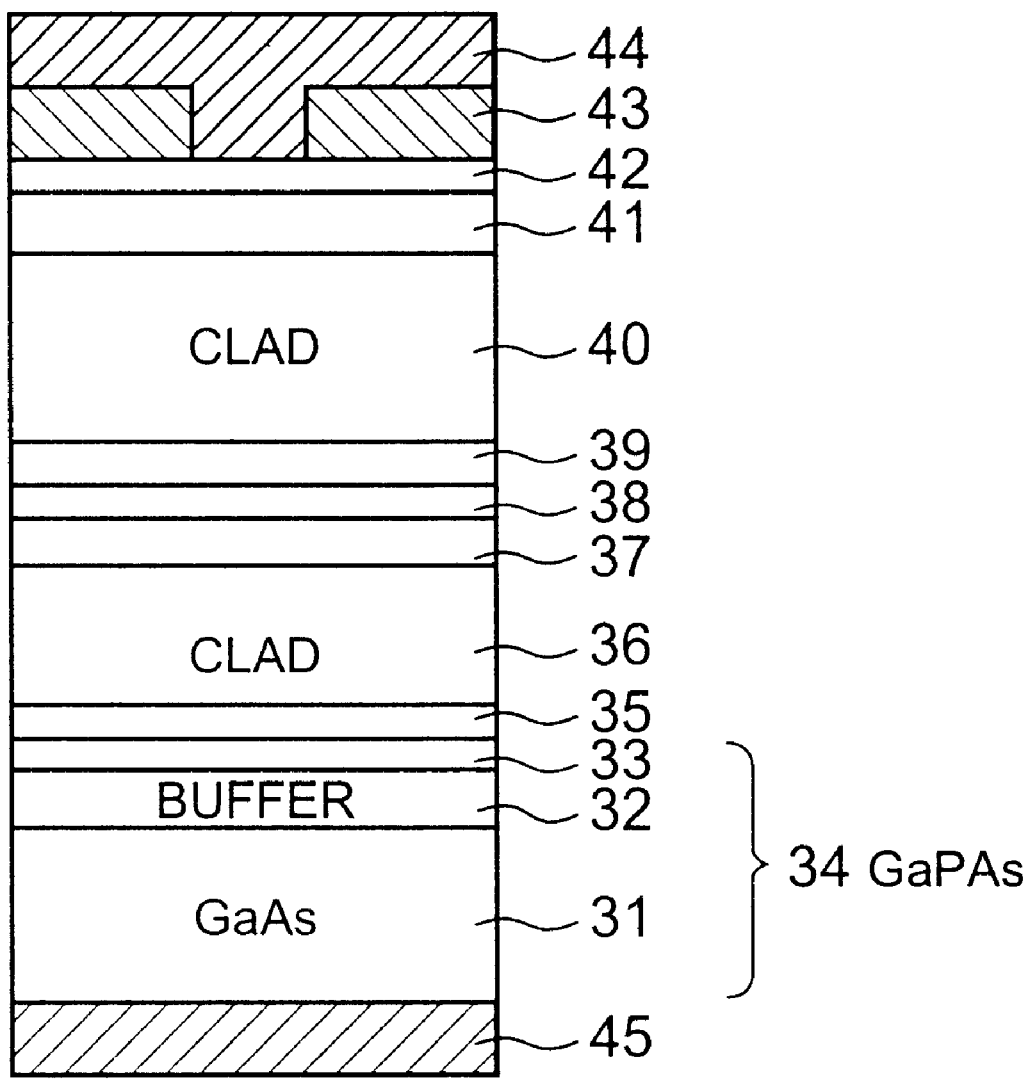
FIG. 10 is a diagram showing the construction of a laser diode according to an eighth embodiment of the present invention.

FIG. 10 shows the construction of a laser diode according to an eighth embodiment of the present invention.

Referring to FIG. 10, the laser diode has an SCH-SQW structure and is constructed on a so-called GaPAs substrate 34.

More specifically, an offset GaAs substrate 31 having a principal surface inclined from the (100) surface in the [011] direction by an offset angle of 15° is used in the present embodiment and a graded buffer layer 32 of n-type GaPAs is formed on the GaAs substrate 31 by a VPE process with a thickness of about 30 μm while changing the composition of P gradually from 0 to 0.4. Further, a planarization layer 33 of n-type GaPAs having a uniform composition of $GaP_{0.4}As_{0.6}$ is formed on the graded buffer layer 32 with a thickness of about 20 μm. Thereby, the graded buffer layer 32 and the planarization layer 33 form, together with the GaAs substrate 31, the GaPAs substrate 34.

Next, on the GaPAs substrate 34 thus formed, a buffer layer 35 of n-type GaInP doped with Se and having a composition of $Ga_{0.7}In_{0.3}P$ is formed with a thickness of about 1 μm, and a bottom cladding layer 36 of n-type AlInP having a composition represented as $(Al_yGa_{1-y})_\beta In_{1-\beta}P_vAs_{1-v}$ (y=1, β=0.7, v=1) is formed epitaxially on the foregoing buffer layer 35 with a thickness of about 1 μm. Further, a bottom optical waveguide layer 37 of undoped AlGaInP having a composition represented as $(Al_zGa_{1-z})_\gamma In_{1-\gamma}P_uAs_{1-u}$ (z=0.1, γ=0.7, u=1) is formed epitaxially on the bottom cladding layer 36 with a thickness of 0.1 μm. It should be noted that the foregoing bottom cladding layer 36 and the bottom optical waveguide layer 37 have a composition that achieves a lattice matching with the GaPAs substrate 34 having the foregoing composition of $GaP_{0.4}As_{0.6}$.

On the optical waveguide layer 37, there is provided an SQW layer 38 of undoped GaInP having a composition represented as $(Al_xGa_{1-x})_\alpha In_{1-\alpha}P_tAs_{1-t}$ (x=0, α=0.55, t=1) as the active layer of the laser diode, wherein the SQW layer 38 is formed epitaxially with a thickness of about 8 nm. It should be noted that the SQW layer 38 having such a composition accumulates therein a compressive strain when formed on the foregoing GaPAs substrate 34.

Further, a top optical waveguide layer 39 of undoped AlGaInP having a composition represented as $(Al_zGa_{1-z})_\gamma In_{1-\gamma}P_uAs_{1-u}$ (z=0.1, γ=0.7, u=1) is formed on the active layer 16 epitaxially with a thickness of about 0.1 μm, and a top cladding layer 40 of p-type AlInP having a composition represented as $(Al_yGa_{1-y})_\beta In_{1-\beta}P_vAs_{1-v}$ (y=1, β=0.7, v=1) is formed epitaxially on the optical waveguide layer 39 with a thickness of about 1 μm. Further, a cap layer 41 of p-type GaInP having a composition of $Ga_{0.7}In_{0.3}P$ is formed epitaxially on the top cladding layer 40 with a thickness of about 0.1 μm, and a contact layer 42 of p-type GaAs is formed further thereon epitaxially with a thickness of about 0.005 μm. The cladding layers 36 and 40 and the optical waveguide layers 37 and 39 have a composition set so as to achieve a lattice matching with the planarization layer 33 at the top part of the GaPAs substrate 34, as noted before.

On the contact layer 42, there is provided an insulating layer 43 of $SiO_2$ and a p-type ohmic electrode 44 is provided on the insulating layer 43 so as to make an ohmic contact with the contact layer 42 at an opening formed in the insulating layer 43. Further, an n-type ohmic electrode 45 is formed on a bottom surface of the GaAs substrate 31. Thereby, the laser diode forms a stripe laser diode. Of course, the construction of FIG. 10 can be modified to form other type of laser diode such as a ridge-guide type laser diode.

According to the present embodiment, a laser diode operable at the wavelength of 635 nm is obtained, wherein it should be noted that the laser diode of the present embodiment produces a laser beam with a TE-polarization mode. Due to the increased bandgap for the cladding layers 36 and 40 or for the optical waveguide layers 37 and 39, the efficiency of carrier confinement into the active layer 38 is improved over the laser diode that uses a composition matching to the GaAs substrate for the cladding layers or for the waveguide layers. Further, associated with the increased bandgap for the SQW layer 38 as a result of accumulation of the compressive strain therein, the thickness of the SQW layer 38 can be increased as compared with the SQW layer that achieves a lattice matching with the GaAs substrate while simultaneously maintaining the desired tuning of the laser oscillation wavelength to the foregoing wavelength of 635 nm. Thereby, the adversary effect of surface states on the stimulated emission taking place in the SQW layer 38 is minimized. Further, associated with the decrease of the Al content in the optical waveguide layers 37 and 39 as compared with the conventional laser diodes for use in the same wavelength band, the problem of damaging occurring at the free edge surface of the laser optical cavity associated with the non-optical recombination centers formed by Al, is successfully eliminated and the laser diode can be operated at a high optical output power with excellent reliability.

In the present embodiment, the cladding layers 36 and 40 are required to have a bandgap larger than the bandgap of the active layer 38 and may have a composition represented as $(Al_yGa_{1-y})_\beta In_{1-\beta}P_vAs_{1-v}$ ($0<y\leq 1$, $0.5<\beta\leq 1$, $0<v\leq 1$). Further, the optical waveguide layers 37 and 39 are required to have a bandgap smaller than the bandgap of the cladding layers 36 and 40 but larger than the bandgap of the active layer 38. The optical waveguide layers 37 and 39 are further required to have a lattice constant coincident to the lattice constant of the cladding layers 36 and 40. Within this limitation, the composition of the optical waveguide layers 37 and 39 can be chosen from the composition of $(Al_zGa_{1-z})_\gamma In_{1-\gamma}P_u As_{1-u}$ ($0 \leq z < 1$, $0.5 < \gamma < 1$, $0 < u \leq 1$). Further, an MQW structure may be used for the active layer 38. The compositional parameter β of the cladding layer 36 or 40 influences the lattice constant thereof, wherein the parameter β is set so that a lattice matching is achieved between the cladding layers 36 and 40 and the planarization layer 33 at the top part of the GaPAs substrate 34.

In the laser diode of the present embodiment, the principal surface of the GaAs substrate 11 may offset the [011] direction from the (100) surface with an offset angle within the range of 0 to 54.7 or in the [0–11] direction within the range of 10 to 54.7° for suppressing the spontaneous formation of natural superlattice structure. As a result of the elimination of the formation of natural superlattice structure, narrowing of the bandgap is eliminated and the construction is suitable for decreasing the laser oscillation wavelength.

[Ninth Embodiment]

Figure 11:
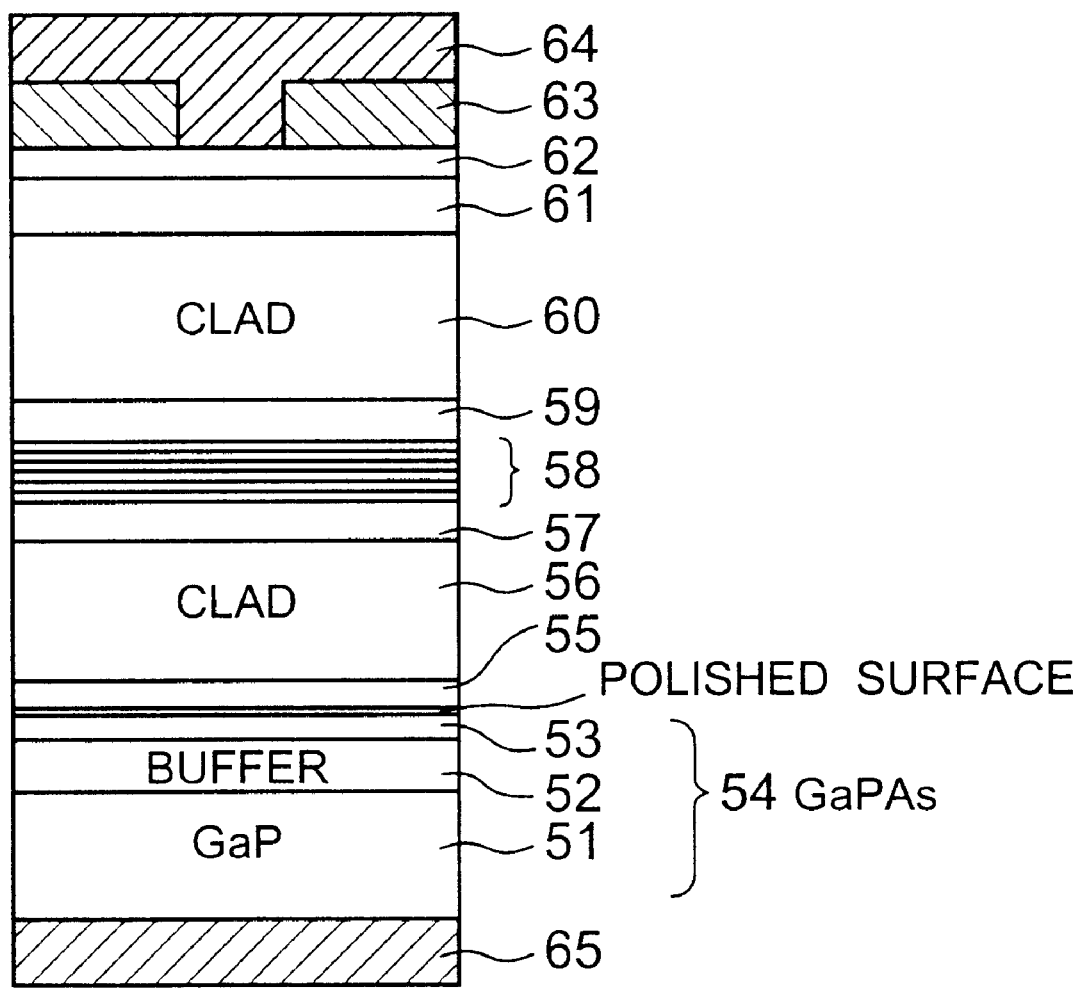
FIG. 11 is a diagram showing the construction of a laser diode according to a ninth embodiment of the present invention.

FIG. 11 shows the construction of a laser diode according to a ninth embodiment of the present invention.

Referring to FIG. 11, the laser diode has an SCH-SQW structure and is constructed on a so-called GaPAs substrate 54.

More specifically, an offset GaP substrate 51 having a principal surface inclined from the (100) surface in the [011] direction by an offset angle of 15° is used in the present embodiment and a graded buffer layer 52 of n-type GaPAs is formed on the GaAs substrate 51 by a VPE process with a thickness of about 30 μm while changing the composition of P gradually from 1 to 0.55. Further, a planarization layer 53 of n-type GaPAs having a uniform composition of $GaP_{0.55}As_{0.45}$ is formed on the graded buffer layer 52 with a thickness of about 20 μm. Thereby, the graded buffer layer 52 and the planarization layer 53 form, together with the GaAs substrate 51, the GaPAs substrate 54.

In the present embodiment, the top surface of the GaPAs substrate 54 thus formed is subjected to a mechanical polishing process so as to eliminate the cross-hatch patterns that tend to develop in such a strained heteroepitaxial system.

After etching the surface of the GaPA substrate 54 slightly by a wet etching process for removing damaged portions, a buffer layer 55 of n-type GaInP having a composition of $Ga_{0.78}In_{0.22}P$ is formed on the GaPAs substrate 54. Further, a bottom cladding layer 56 of n-type AlInP having a composition represented as $(Al_y Ga_{1-y})_\beta In_{1-\beta}P_v As_{1-v}$ (y=0.7, β=0.78, v=1) is formed epitaxially on the foregoing buffer layer 55 with a thickness of about 1 μm. Further, a bottom optical waveguide layer 57 of undoped GaInP having an Al-free composition represented as $(Al_z Ga_{1-z})_\gamma In_{1-\gamma}P_u As_{1-u}$ (z=0, ã=0.78, u=1) is formed epitaxially on the bottom cladding layer 56 with a thickness of 0.1 μm. It should be noted that the foregoing bottom cladding layer 56 and the bottom optical waveguide layer 57 have a composition that achieves a lattice matching with the GaPAs substrate 54 having the foregoing composition of $GaP_{0.4}As_{0.6}$.

On the optical waveguide layer 57, there is provided an active layer 58 having an MQW structure, wherein three undoped GaPAs quantum well layers each having a thickness of 8 nm and a composition represented as $(Al_x Ga_{1-x})_\alpha In_{1-\alpha}P_t As_{1-t}$ (x=0, α=1, t=0.3) and three undoped Al-free barrier layers of GaInP each having a thickness of 10 nm and a composition represented as $(Al_z Ga_{1-z})_\gamma In_{1-\gamma}P_u As_{1-u}$ (z=0, γ=0.78, u=1) are stacked alternately. In the active layer 58, it should be noted that the quantum well layers of the foregoing composition accumulate therein a compressive strain.

Further, a top optical waveguide layer 59 of undoped GaInP having a Al-free composition represented as $(Al_z Ga_{1-z})_\gamma In_{1-\gamma}P_u As_{1-u}$ (z=0, γ=0.78, u=1) is formed on the active layer 58 epitaxially with a thickness of about 0.1 μm, and a top cladding layer 60 of p-type AlInP having a composition represented as $(Al_y Ga_{1-y})_\alpha In_{1-\beta}P_v As_{1-v}$ (y=0.7, β=0.78, v=1) is formed epitaxially on the optical waveguide layer 59 with a thickness of about 1 μm. Further, a cap layer 61 of p-type GaInP having a composition of $Ga_{0.7}In_{0.3}P$ is formed epitaxially on the top cladding layer 60 with a thickness of about 0.1 μm, and a contact layer 62 of p-type GaAs is formed further thereon epitaxially with a thickness of about 0.005 μm. The cladding layers 56 and 60 and the optical waveguide layers 57 and 59 have a composition set so as to achieve a lattice matching with the top part of the GaPAs substrate 54 of the composition $Ga_{0.78}In_{0.22}P$, as noted before.

On the contact layer 62, there is provided an insulating layer 63 of $SiO_2$ and a p-type ohmic electrode 64 is provided on the insulating layer 63 so as to make an ohmic contact with the contact layer 62 at an opening formed in the insulating layer 63. Further, an n-type ohmic electrode 65 is formed on a bottom surface of the GaAs substrate 51. Thereby, the laser diode forms a stripe laser diode. Of course, the construction of FIG. 11 can be modified to form other type of laser diode such as a ridge-guide type laser diode.

In the laser diode of the present embodiment, the quantum well layers in the active layer 58 are added with As so as to adjust the bandgap for obtaining the laser oscillation at the wavelength of 635 nm in view of the fact that an excessive strain would be needed if an As-free composition is used for the quantum well layers for producing the laser oscillation at the foregoing wavelength of 635 nm.

According to the present embodiment, a laser diode operable at the wavelength of 635 nm is obtained, wherein it should be noted that the laser diode of the present embodiment produces a laser beam with a TE-polarization mode. Due to the increased bandgap for the cladding layers 56 and 60 or for the optical waveguide layers 57 and 59, the efficiency of carrier confinement into the active layer 58 is improved over the laser diode that uses a GaAs lattice-matching composition for the cladding layers or for the waveguide layers. Further, associated with the increased bandgap for the quantum well layers in the active layer 58 as a result of accumulation of the compressive strain therein, the thickness of the quantum well layers can be increased as compared with the case in which a composition that achieves a lattice matching with the GaAs substrate is used while simultaneously maintaining the desired tuning of the laser oscillation wavelength to the foregoing wavelength of 635 nm. Thereby, the adversary effect of surface states on the stimulated emission taking place in the quantum well layers in the active layer 38 is minimized. Further, associated with the Al-free composition for the active layer 58 and for the optical waveguide layers 57 and 59, the problem of damaging occurring at the free edge surface of the laser optical cavity associated with the non-optical recombination centers formed by Al, is successfully eliminated and the laser diode can be operated at a high optical output power with excellent reliability.

In the present embodiment, the cladding layers 46 and 60 are required to have a bandgap larger than the bandgap of the active layer 58 and may have a composition represented as $(Al_y Ga_{1-y})_\beta In_{1-\beta}P_v As_{1-v}$ (0<y≦1, 0.5<β<1, 0<v≦1). The compositional parameter β of the cladding layer 56 or 60 influences the lattice constant thereof, wherein the parameter β is set so that a lattice matching is achieved between the cladding layer 56 and 60 and the top part of the GaPAs substrate 54.

In the laser diode of the present embodiment, the principal surface of the GaAs substrate 51 may offset in the [011] direction from the (100) surface with an offset angle within the range of 0° to 54.7° for suppressing the spontaneous formation of natural superlattice structure. As a result of the elimination of the formation of natural superlattice structure, narrowing of the bandgap is eliminated and the construction is suitable for decreasing the laser oscillation wavelength.

[Tenth Embodiment]

Figure 12:
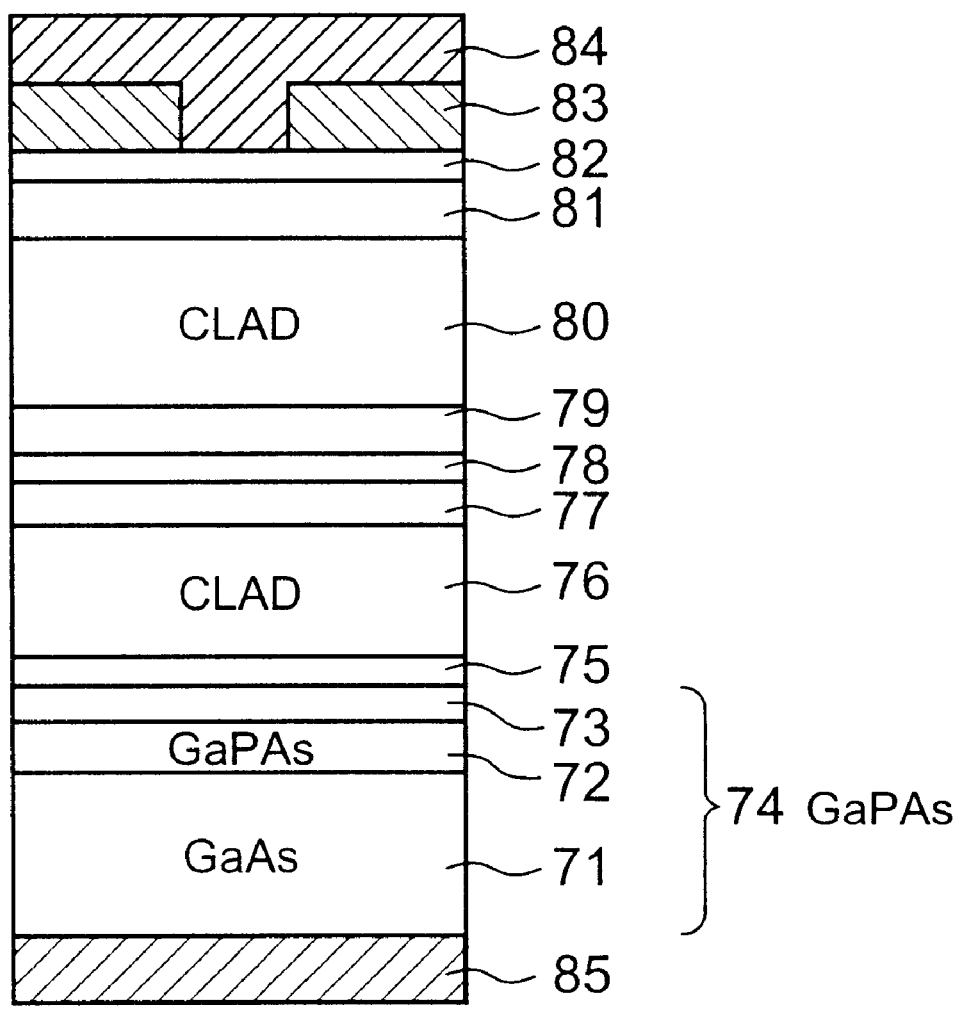
FIG. 12 is a diagram showing the construction of a laser diode according to a tenth embodiment of the present invention.

FIG. 12 shows the construction of a laser diode according to an eighth embodiment of the present invention.

Referring to FIG. 12, the laser diode has an SCH-SQW structure and is constructed on a so-called GaPAs substrate 74.

More specifically, an offset GaAs substrate 71 having a principal surface inclined from the (100) surface in the [110] direction by an offset angle of 2° is used in the present embodiment and a graded buffer layer 72 of n-type GaPAs is formed on the GaAs substrate 71 by a VPE process with a thickness of about 30 μm while changing the composition of P gradually from 0 to 0.4. Further, a planarization layer 73 of n-type GaPAs having a uniform composition of $GaP_{0.4}As_{0.6}$ is formed on the graded buffer layer 32 with a thickness of about 20 μm. Thereby, the graded buffer layer 72 and the planarization layer 73 form, together with the GaAs substrate 71, the GaPAs substrate 74. At the top part of the GaPAs substrate, the lattice misfit with respect to the GaAs substrate 71 is effectively relaxed and the substrate 74 can be regarded as a single substrate having a composition of $GaP_{0.4}As_{0.6}$.

Next, on the GaPAs substrate 74 thus formed, a buffer layer 75 of n-type GaInP doped with Se and having a composition of $GaP_{0.4}As_{0.6}$ is formed with a thickness of about 1 μm, and a bottom cladding layer 76 of n-type AlInPAs having an As-containing composition represented as $(Al_yGa_{1-y})_\beta In_{1-\beta}P_\nu As_{1-\nu}$ (y=0.5, β=0.8, ν=0.85) is formed epitaxially on the foregoing buffer layer 75 with a thickness of about 1 μm. Further, a bottom optical waveguide layer 77 of undoped GaInP having an Al-free composition represented as $(Al_zGa_{1-z})_\gamma In_{1-\gamma}P_u As_{1-u}$ (z=0, γ=0.7, u=1) is formed epitaxially on the bottom cladding layer 76 with a thickness of 0.1 μm. It should be noted that the foregoing bottom cladding layer 76 and the bottom optical waveguide layer 77 have a composition that achieves a lattice matching with the GaPAs substrate 74 having the foregoing composition of $GaP_{0.4}As_{0.6}$.

On the optical waveguide layer 77, there is provided an SQW layer 78 of undoped GaInPAs having an Al-free composition represented as $(Al_xGa_{1-x})_\alpha In_{1-\alpha}P_t As_{1-t}$ (x=0, α=0.65, t=0.9) as the active layer of the laser diode, wherein the SQW layer 78 is formed epitaxially with a thickness of about 25 nm. It should be noted that the SQW layer 78 having such a composition accumulates therein a compressive strain when formed on the foregoing GaPAs substrate 74.

Further, a top optical waveguide layer 79 of undoped AlGaInP having an Al-free composition represented as $(Al_zGa_{1-z})_\gamma In_{1-\gamma}P_u As_{1-u}$ (z=0, γ=0.7, u=1) is formed on the active layer 78 epitaxially with a thickness of about 0.1 μm, and a top cladding layer 80 of p-type AlGaInPAs having a composition represented as $(Al_yGa_{1-y})_\beta In_{1-\beta}P_\nu As_{1-\nu}$ (y=0.5, β=0.8, ν=0.85) is formed epitaxially on the optical waveguide layer 79 with a thickness of about 1 μm. Further, a cap layer 81 of p-type GaInP having a composition of $Ga_{0.7}In_{0.3}P$ is formed epitaxially on the top cladding layer 80 with a thickness of about 0.1 μm, and a contact layer 82 of p-type GaAs is formed further thereon epitaxially with a thickness of about 0.005 μm. The cladding layers 76 and 80 and the optical waveguide layers 77 and 79 have a composition set so as to achieve a lattice matching with the GaPAs substrate 74, as noted before.

On the contact layer 82, there is provided an insulating layer 83 Of $SiO_2$ and a p-type ohmic electrode 84 is provided on the insulating layer 83 so as to make an ohmic contact with the contact layer 82 at an opening formed in the insulating layer 83. Further, an n-type ohmic electrode 85 is formed on a bottom surface of the GaAs substrate 71. Thereby, the laser diode forms a stripe laser diode. Of course, the construction of FIG. 12 can be modified to form other type of laser diode such as a ridge-guide type laser diode.

According to the present embodiment, a laser diode operable at the wavelength of 666 nm is obtained In the laser diode of the present embodiment, the principal surface of the GaAs substrate 71 is offset slightly in the [011] direction from the (100) surface with a small offset angle of 2°. When a layer of the AlGaInP system is grown on such a slightly offset GaAs substrate by way of an MOCVD process, there occurs an extensive hillock formation on the substrate surface, wherein the degree of hillock formation is enhanced when the Al content is large in the epitaxial layer grown on the substrate. Such a hillock formation provides a disastrous effect on the device performance or yield of production of the laser diode.

Meanwhile, the present inventor has discovered that the hillock formation can be successfully suppressed by incorporating As into the AlGaInP layer thus grown on the substrate. It is believed that As thus introduced effectively suppress the droplet formation of Ga or Al on the surface of the substrate. Further, the laser diode of the present embodiment, not containing Al in the optical waveguide layers 77 and 79 or in the quantum well layer 78, is advantageous for improving the efficiency of laser oscillation. Further, the laser diode of the present embodiment can stably produce a high output optical power.

In the present embodiment, too, it is possible to replace the SQW layer 78 with an MQW layer such as the one described with reference to 11.

Further, the laser diodes described heretofore can be used also for forming a light-emitting diode.

[Eleventh Embodiment]

Next, a laser diode according to an eleventh embodiment of the present invention will be described.

Generally, a laser diode is formed with a current confinement structure for effectively confining the carriers injected into the laser diode so that the carriers are concentrated along an axial region of the active layer so that efficient stimulated emission takes place along such an axial region. In order to achieve such a current confinement, it is commonly practiced to form a ridge structure in the semiconductor layered body of the laser diode such that the ridge structure extends in the axial direction of the laser diode. Alternatively, a stripe structure is formed so as to extend the layered body of the laser diode in the axial direction thereof.

In order to form such a ridge current confinement structure or a stripe current confinement structure, it is necessary to apply an etching process to the layered body of the laser diode, while such an etching process uses an etching stopper for stopping the etching process at the desired depth or desired location. In order to facilitate the production of the laser diode, it is preferable to form the etching stopper layers in the same process for forming the epitaxial layers of the laser diode by using the same family of materials while adjusting the composition such that the etching stopper layer shows a resistance against the etching used for etching other epitaxial layers.

In view of the fact that the etching stopper layer used for such a purpose in a laser diode does not contribute to the laser oscillation, it is desired that the etching stopper layer does not absorb the optical radiation produced in the laser diode. For this purpose, it is desired that the etching stopper layer has a large bandgap. In the laser diode that uses the III-V system of AlGaInPAs, such as the one producing red optical radiation, there is a wide possibility of selection of materials for increasing the bandgap of the etching stopper layer by merely increasing the Al content. However, increase of Al content in such an etching stopper layer generally increases the etching rate thereof and the etching stopper layer thus containing a large amount of Al may not function as an efficient etching stopper.

Thus, it has been practiced to induce a tensile strain in such an etching stopper so that the absorption optical wavelength thereof is offset from the wavelength of the laser oscillation.

However, such an approach has a drawback in that the thickness of the etching stopper layer has to be held within the critical thickness thereof, while the use of such a thin etching stopper layer tends to cause the problem of non-uniform etching. This problem becomes particularly serious in visible wavelength laser diodes that produces an optical beam with a wavelength such as 633 nm or shorter. In such a case, a strained quantum well structure is needed for the etching stopper layer, wherein the desired thickness of the quantum well layer can become several nanometers or less. Otherwise, it is necessary to increase the strain to 1% or more, while such the critical thickness becomes very small in such a highly strained epitaxial layer.

Thus, the present embodiment provides a laser diode structure that addresses the foregoing problems of the related art.

Figure 13:
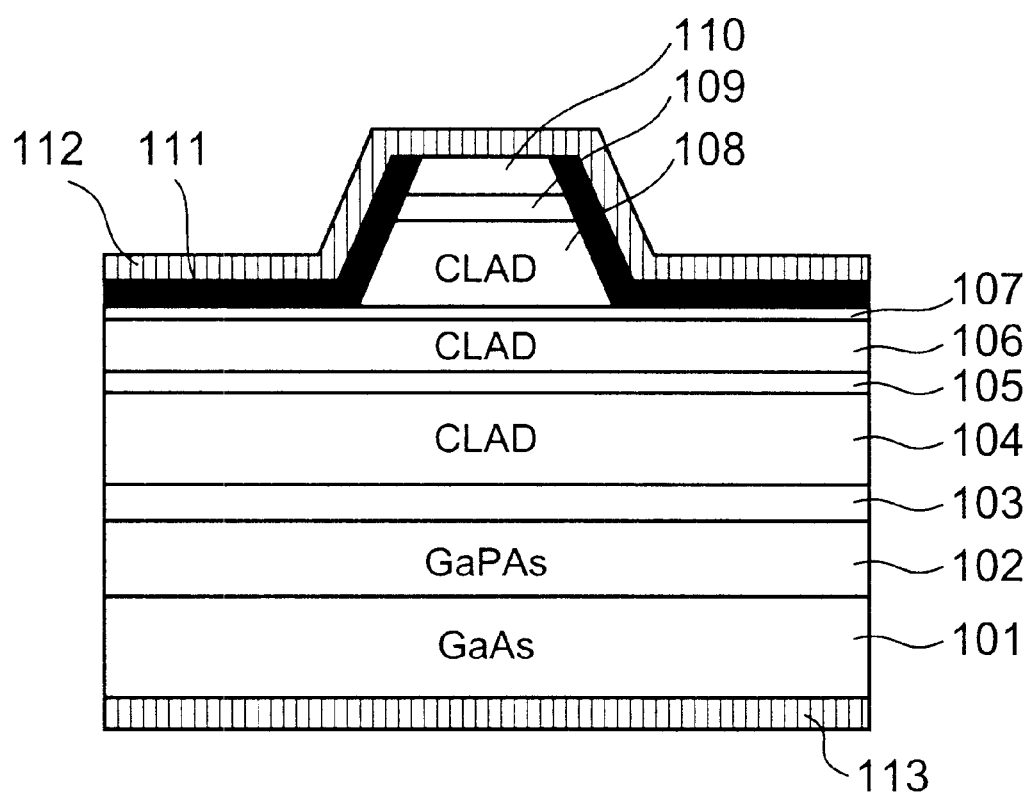
FIG. 13 is a diagram showing the construction of a laser diode according to an eleventh embodiment of the present invention.

FIG. 13 shows the structure of a laser diode according to an eleventh embodiment of the present invention.

Referring to FIG. 13, the laser diode is constructed on a substrate 101 of n-type GaAs and includes a graded buffer layer 102 of n-type GaPAs in which the As content therein is changed from 1 at the bottom surface contacting the GaAs substrate 101 to 0.6 at the top surface.

On the graded buffer layer 102, there is formed a buffer layer 103 of n-type GaPAs having a composition of $GaAs_{0.6}P_{0.4}$, and a bottom cladding layer 104 of n-type AlGaInP is formed epitaxially on the buffer layer 103. The bottom cladding layer 104 has a composition that achieves a lattice matching with the top part of the graded buffer layer 102. Further, an active layer 105 of undoped GaPAs or GaInPAs is formed epitaxially on the bottom cladding layer 104 and a top cladding layer 106 of p-type AlGaInP is formed epitaxially further on the active layer 105.

In the present embodiment, it should be noted that the top cladding layer 106 is covered with an etching stopper layer 107 of p-type GaInP epitaxially, and a further cladding layer 108 of p-type AlGaInP is formed epitaxially on the etching stopper layer 107.

Further, an anti-spike layer 109 of p-type GaInP and a contact layer 110 of p-type GaAs are formed consecutively on the cladding layer 108.

The contact layer 110, the anti-spike layer 109 and the cladding layer 108 are then patterned by a wet etching process while using an $SiO_2$ pattern (not shown) as an etching mask, to form a current-confining ridge structure extending axially through the semiconductor layered body of the laser diode. In this wet etching process, the contact layer 110 is first etched by a sulfuric etchant until the anti-spike layer 109 is exposed. Upon the exposure of the anti-spike layer 109, the etchant is switched to hydrochloric acid and the anti-spike layer 109 is etched. Further, the etchant is switched to the sulfuric etchant again and the cladding layer 108 of p-type AlGaInP is etched, until the etching stopper layer 107 is exposed. Upon exposure of the etching stopper layer 107, the wet etching process stops spontaneously.

After the formation of the forgoing ridge structure, an insulating layer 111 of $SiO_2$ is deposited and a p-type electrode 112 is deposited on the insulating layer 111 such that the p-type electrode 112 makes an ohmic contact with the contact layer 110 at the top part of the ridge structure via an opening formed in the insulating layer 111.

In the present embodiment, it should be noted that the etching stopper layer 107 of p-type GaInP has a composition that achieves a lattice matching to the buffer layer 103 of $GaAs_{0.6}P_{0.4}$, and the etching stopper layer 107 can have a large thickness of as large as 50 nm without inducing creation of dislocations therein. Thereby, the etching stopper layer 107 functions as a reliable etching stopper and the problem of non-uniform patterning of the ridge structure, which tends to arise when an extremely thin etching stopper is used, is effectively eliminated.

In the present embodiment, it should be noted that the etching stopper layer 107 has a bandgap wavelength of 560 nm, which is shorter than the bandgap wavelength of the GaPAs active layer 105. Thus, the problem of absorption of the optical radiation by the etching stopper layer 107 does not occur in the laser diode of the present embodiment.

In the present embodiment, it is possible to form a visible laser diode that produces red optical radiation in the wavelength range of 630–660 nm by using a GaInP mixed crystal for the active layer 105 as noted before. The etching stopper layer 107 of GaInP does not absorb the optical radiation of the foregoing wavelength band.

[Twelfth Embodiment]

Figure 14:
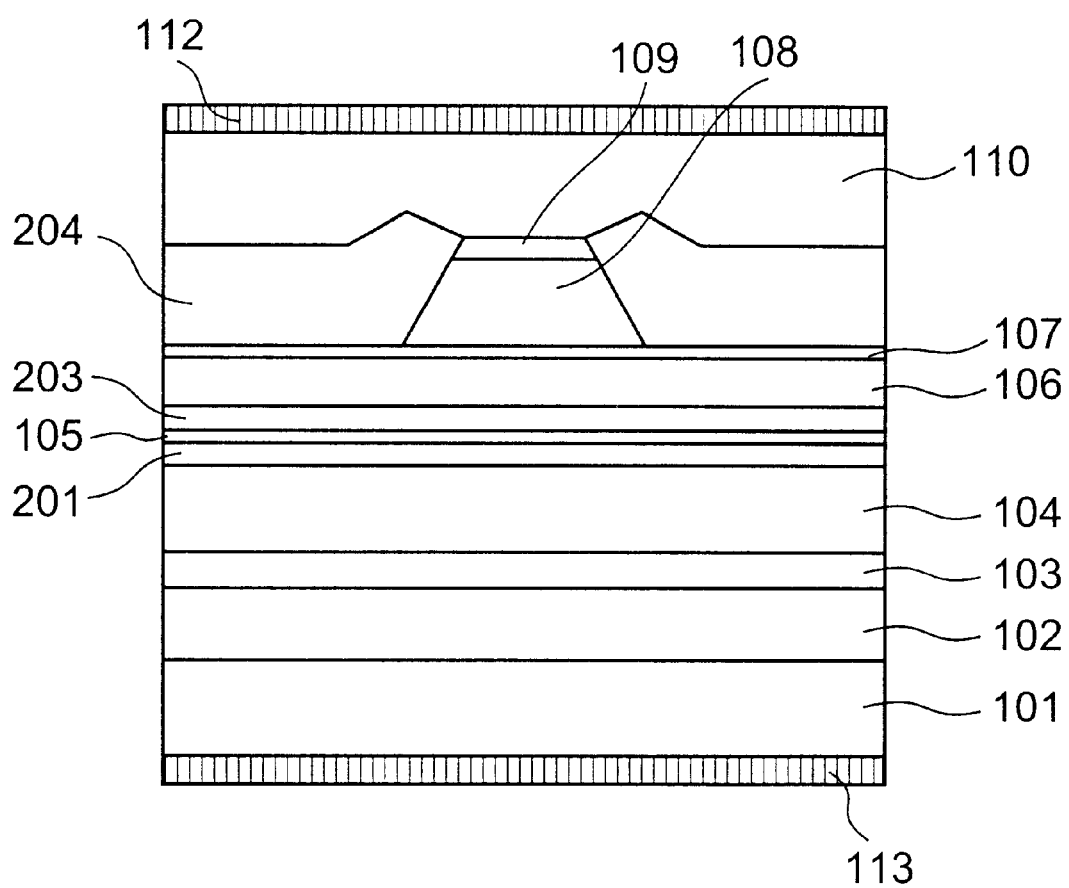
FIG. 14 is a diagram showing the construction of a laser diode according to a twelfth embodiment of the present invention.

FIG. 14 shows the construction of a laser diode according to a twelfth embodiment of the present invention, wherein those parts corresponding to the parts described previously are designated by the same reference numerals and the description thereof will be omitted. It should be noted that the present embodiment addresses the same problem explained in the previous embodiment with reference to FIG. 13.

Referring to FIG. 14, the laser diode has an SCH-SQW structure and includes optical waveguide layers 201 and 203 interposed between the active layer 105 and the bottom cladding layer 104 or between the active layer 105 and the top cladding layer 106. In the present embodiment, the active layer 105 has an Al-free composition of GaInPAs tuned to the red optical wavelength, while the optical waveguide layers 201 and 203 have an Al-free composition in the system of GaInP.

Further, the laser diode of FIG. 14 uses a pair of current confinement regions 204 of n-type GaPAs at both lateral sides of the ridge structure, wherein the current confinement regions 204 have a composition of $GaAs_{0.6}P_{0.4}$. In other words, the current confinement regions 204 have a lattice constant that matches the lattice constant of the buffer layer 103.

As the current-confinement regions 204 of n-type GaPAs forms the desired current confinement together with the ridge structure of the p-type, the laser diode of FIG. 14 does not require an insulating layer such as the layer 111 used in the previous embodiment, and the p-type contact layer 110 of GaAs covers the regions 204 and the ridge structure uniformly. Further, the p-type electrode 112 covers the contact layer 110 uniformly.

As explained with reference to the previous embodiments, the laser diode of the present embodiment, which lacks Al in the optical waveguide layers 201 and 203 can operate stably at high output power without causing damage at the cavity edge surface.

Again, the problem of optical absorption by the etching stopper layer 107 is successfully eliminated in the present embodiment while securing a sufficient thickness for the etching stopper layer.

As is well known in the art, the current-confinement regions 204 at both lateral sides of the central ridge structure induces a waveguide loss by absorbing the optical radiation leaking outside the ridge structure, and the optical radiation produced in the active layer 105 is effectively guided along the central ridge structure.

As the current-confinement structure 204 is formed of GaPAs, which is an Al-free composition, as noted previously, no substantial oxidation occurs at the surface thereof, and the contact layer 110 can be grown thereon with high quality.

[Thirteenth Embodiment]

Next, a laser diode according to a thirteenth embodiment of the present invention will be described with reference to FIG. 15, wherein those parts corresponding to the parts described previously are designated by the same reference numerals and the description thereof will be omitted. It should be noted that the present embodiment addresses the same problem explained in the previous embodiment with reference to FIG. 13 or 14.

Figure 15:
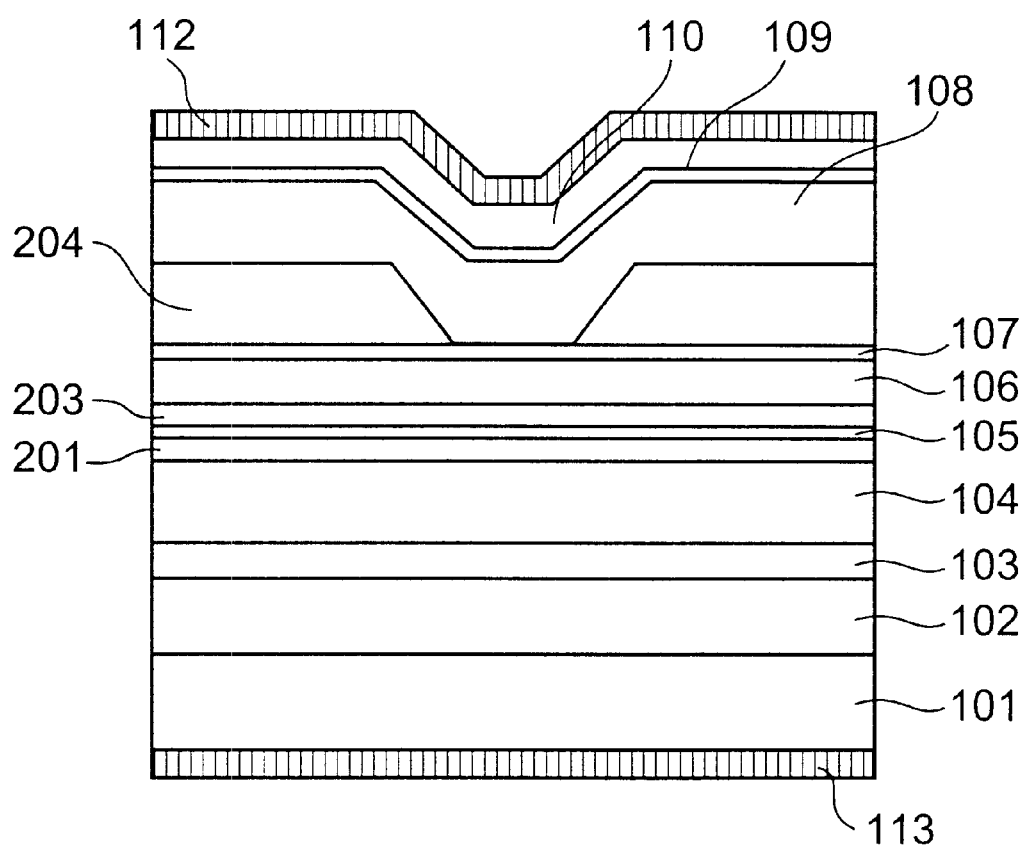
FIG. 15 is a diagram showing the construction of a laser diode according to a thirteenth embodiment of the present invention.

Referring to FIG. 15, the laser diode has a layered structure similar to that of FIG. 13, except that the current confinement regions 204 is formed in the form of a layer having a central opening extending in the axial direction of the laser diode, and the cladding layer 108 is provided on the current confinement layer 204 so as to make a contact with the exposed GaInP etching stopper layer 107 at the foregoing opening. The Cladding layer 108 is further covered with the anti-spike layer 108 and the contact layer 109 consecutively, and the p-type ohmic electrode 110 covers the top surface of the contact layer 110. Further, the n-type ohmic electrode 113 is formed on the bottom surface of the GaAs substrate 101.

In this construction, too, the GaInP layer 107 functions as an effective etching stopper when forming the central opening in the current confinement layer 204 by a wet etching process. Thereby, a mixture of sulfuric acid, hydrogen peroxide and water may be used for the etchant. Due to the large bandgap of GaInP, a sufficient thickness can be secured for the layer 107 without causing optical absorption of the optical beam produced in the active layer 105. It is not necessary to introduce strain in the etching stopper layer 107.

As is well known in the art, the current-confinement regions 204 at both lateral sides of the central opening induces a waveguide loss by absorbing the optical radiation leaking laterally from the central axial region of the laser diode. Thereby, the device operates as a stable single-mode laser diode even when operated at a large optical output power.

In view of the fact that the current-confinement structure 204 having an Al-free composition, the epitaxial layers 108–110 can be grown thereon with high-quality.

[Fourteenth Embodiment]

Figure 16:
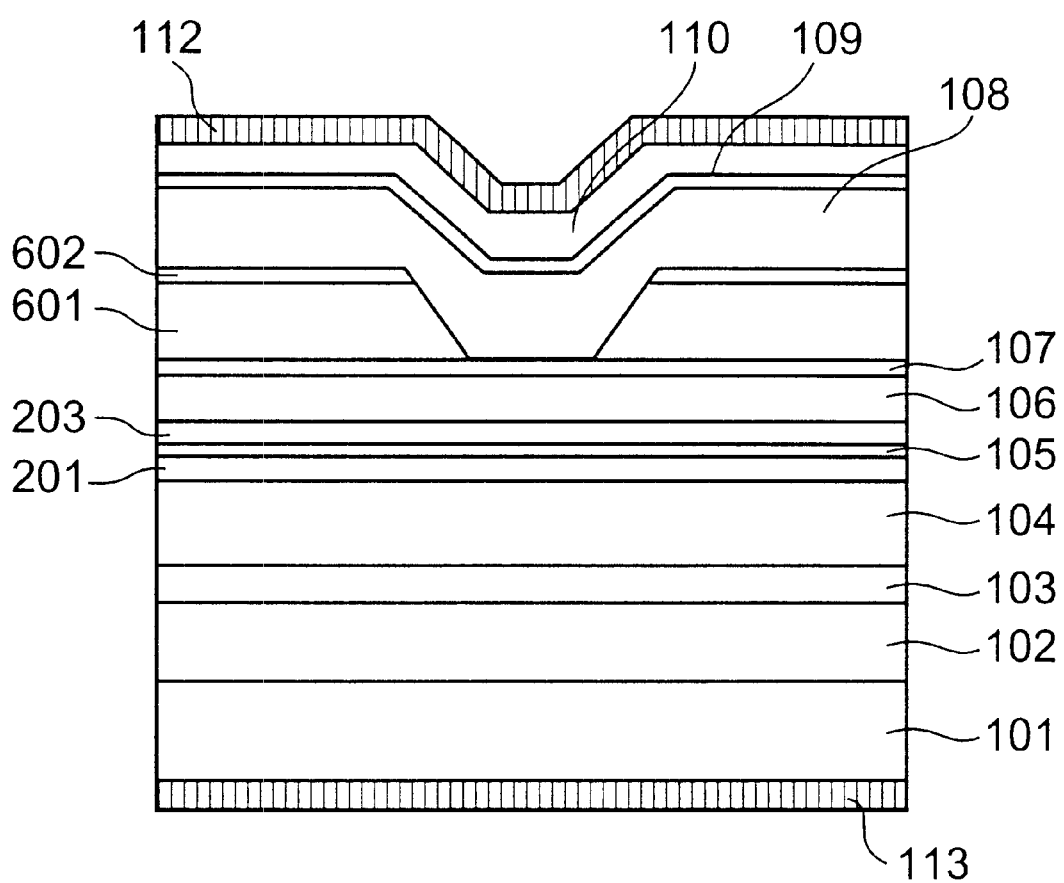
FIG. 16 is a diagram showing the construction of a laser diode according to a fourteenth embodiment of the present invention.

FIG. 16 shows the construction of a laser diode according to a fourteenth embodiment of the present invention, wherein those parts corresponding to the part described previously will be designated by the same reference numerals and the description thereof will be omitted. It should be noted that the present embodiment addresses the same problem explained in the previous embodiments with reference to FIGS. 13–15.

In the present embodiment, a current-confinement structure 601 of n-type AlInP is used in place of the current-confinement structure 204 of GaPAs, and the optical absorption by the current-confinement structure 204 is eliminated. In such a construction, the external differential quantum efficiency of the laser diode is improved.

In order to facilitate the growth of further epitaxial layers on the current-confinement structure 601, the current-confinement structure, which now contains Al, is covered with a cap layer 602 of n-type GaPAs.

It should be noted that the structure of FIG. 16 is also effective for guiding the optical beam along the central axial region of the laser diode in view of the fact that the regions 601 of AlInP have a lower refractive index as compared with the cladding layer 106 or 108 of AlGaInP.

In any of the foregoing embodiments of FIGS. 13–16, it should be noted that GaInP etching stopper layer 107 functions as an effective etching stopper layer also when a mixture of hydrochloric acid and phosphoric acid or a mixture of sulfuric acid, hydrogen peroxide and water is used for the etchant.

[Fifteenth Embodiment]

Next, a laser diode according to a fifteenth embodiment of the present invention will be described with reference to FIGS. 17–19.

In a laser diode or a light-emitting semiconductor device that produces an optical radiation with a wavelength of 530 nm to visible wavelength range, particularly in the wavelength range of red optical radiation of 630–680 nm, the confinement of carriers, particularly the electrons in the active layer is an important factor for improving the efficiency of light emission, as explained already with reference to FIGS. 4A and 4B.

In order to improve the efficiency of carrier confinement, Japanese Laid-Open Patent Publication 4-114486 proposes a barrier layer in the p-type cladding layer so as to block the electrons overflowing from the active layer. The reference further proposes to use a multiple quantum barrier (MQB) structure for the barrier layer. A MQB structure enhances the apparent barrier height by inducing a multiple reflection of electron waves in a superlattice structure. Such an MQB structure is also proposed in the Japanese Laid-Open Patent Publication 7-235733 with regard to the AlGaInP system.

On the other hand, such conventional proposal has been made with reference to a laser diode using a material system that achieves a lattice matching to GaAs. In other words, the laser diodes of these related art are not the device for producing visible wavelength optical radiation.

Thus, the technology of providing such a carrier blocking barrier layer in the laser diode operable in the visible wavelength band has not been established.

In the preceding embodiments, description has been made with regard to the use of a GaPAs substrate having an effective lattice constant between the lattice constant of GaAs and the lattice constant of GaP, for the substrate of visible optical wavelength laser diode operating in the red color wavelength band.

Figure 1:
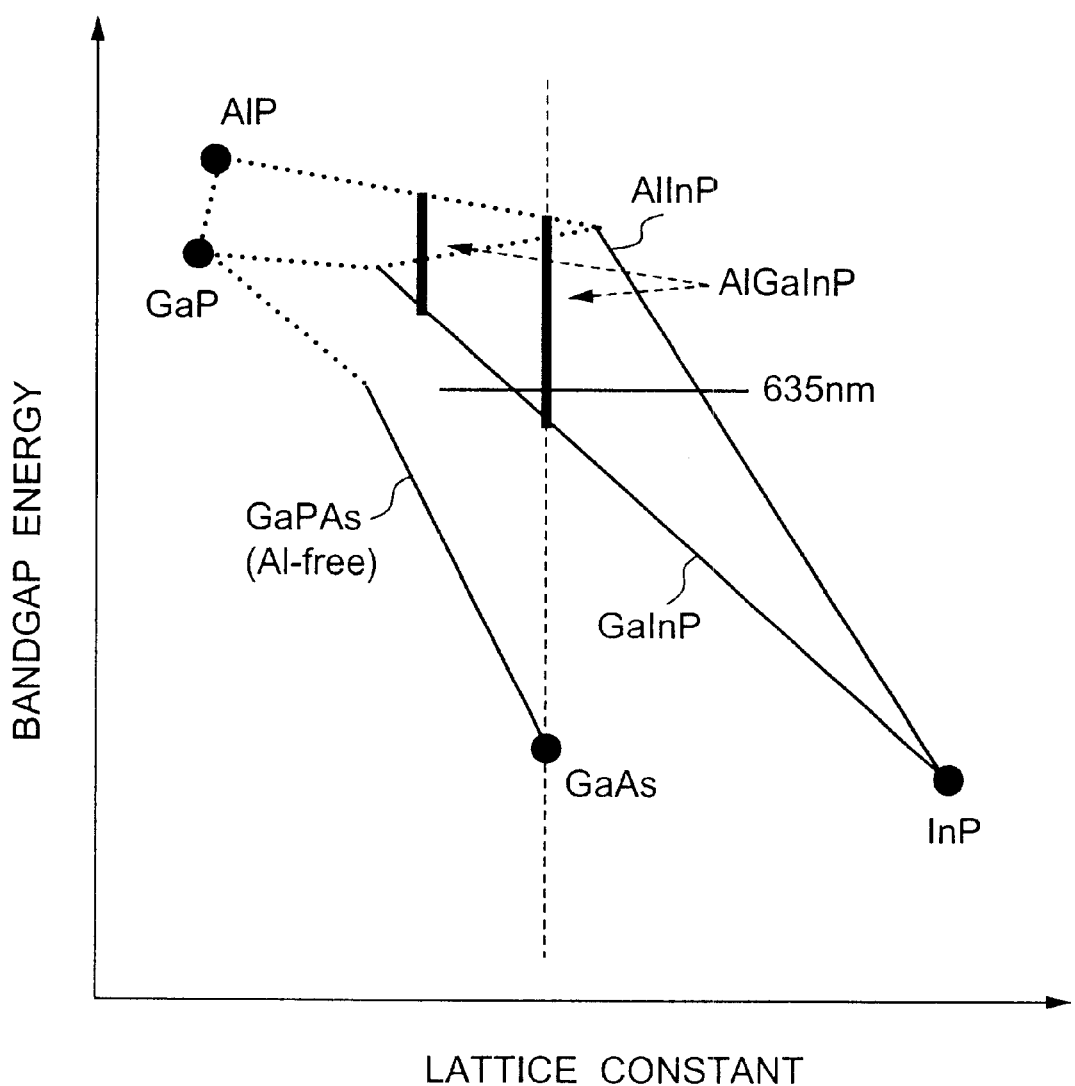
FIG. 1 is a diagram showing the band diagram of the AlGaInPAs system.
Figure 17:
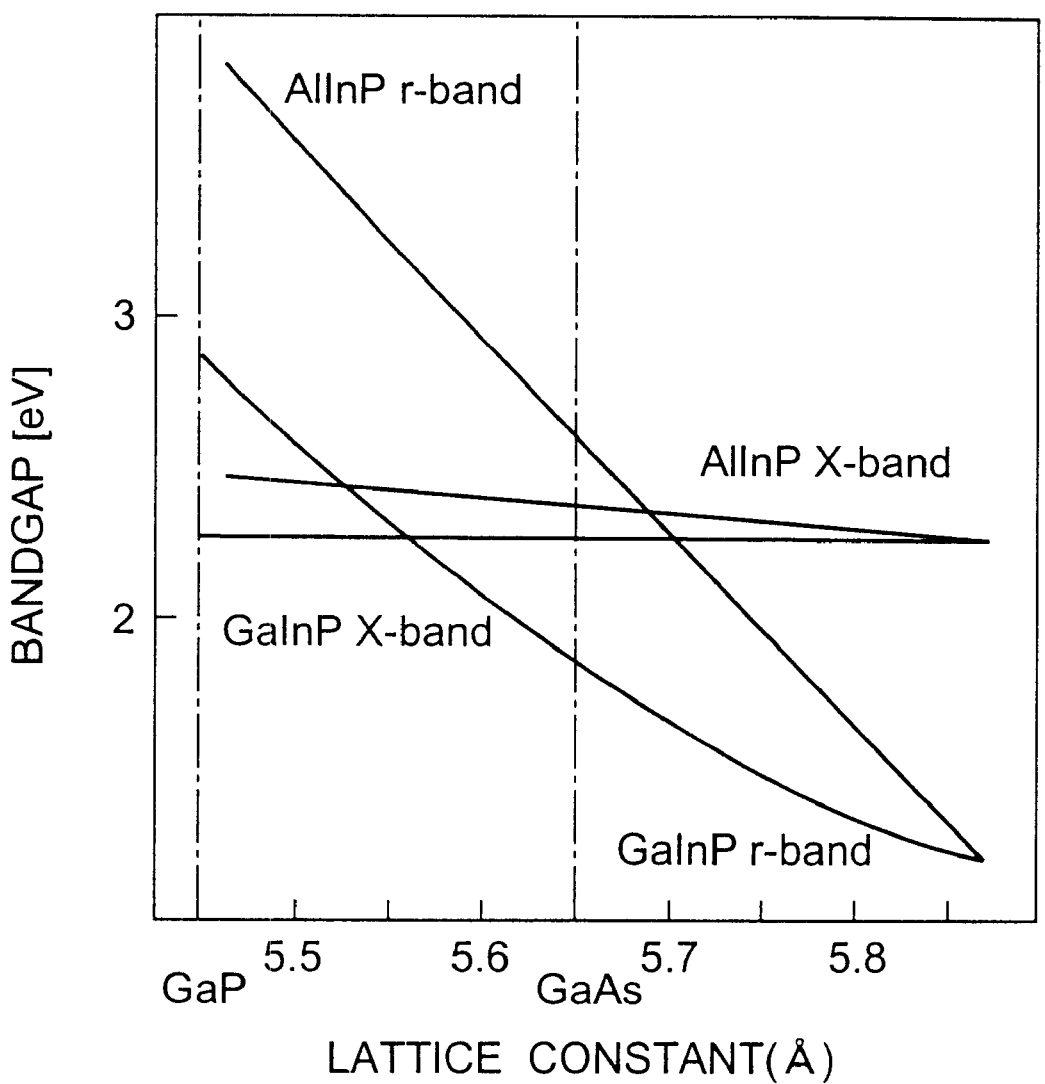
FIG. 17 is a band diagram explaining the principle of a fifteenth embodiment of the present invention.

FIG. 17 shows the band diagram showing a part of the band structure of the AlGaInP system of FIG. 1.

Referring to FIG. 17, it can be seen that various widegap materials are available in the system of AlGaInP when the composition thereof is chosen offset from the lattice matching composition to GaAs.

Thus, the present embodiment provides a laser diode constructed on a GaPAs substrate and operable at the wavelength of 630–660 nm, wherein such an MQB carrier blocking layer is provided in the cladding layer for increasing the efficiency of carrier confinement.

Figure 18:
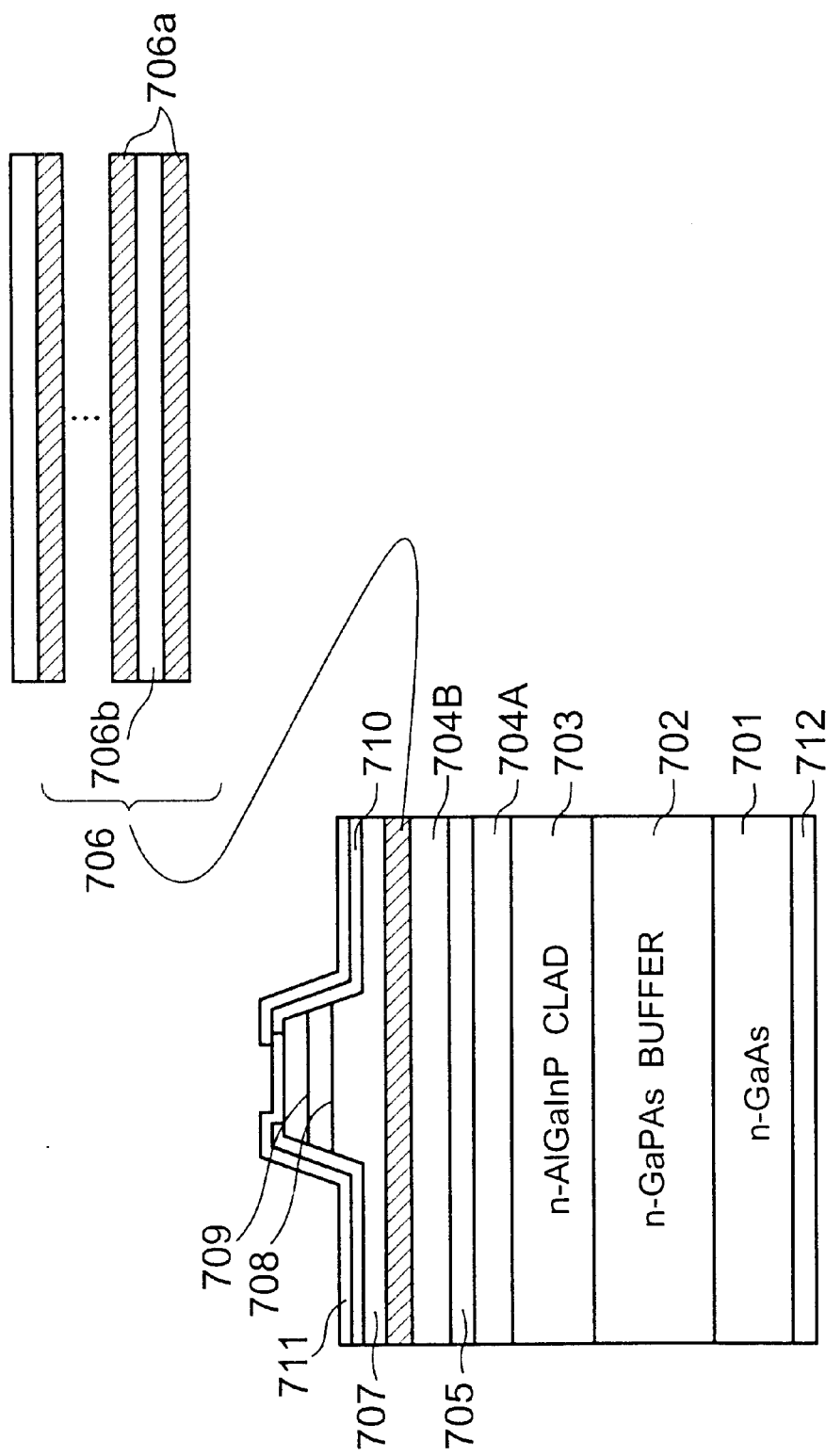
FIG. 18 is a diagram showing the construction of a laser diode according to the fifteenth embodiment of the present invention.

FIG. 18 shows the construction of the laser diode according to the present embodiment.

Referring to FIG. 18, the laser diode is constructed on an n-type GaAs substrate 701 covered with a buffer layer 702 of a GaPAs material, wherein the buffer layer 702 has a composition changing gradually from GaAs to $GaP_{0.3}As_{0.7}$.

On the GaPAs buffer layer 702, there is provided a bottom cladding layer 703 of n-type AlGaInP having a composition represented as $(Al_{a1},Ga_{1-a1})_{b1}In_{1-b1}P$ (0.51<b1<1), wherein the compositional parameter a1 may be set to 1 and the compositional parameter b1 may be set to 0.66 in a typical example. The parameters a1 and b1 are determined so that the cladding layer 703 achieves a lattice matching with the GaPAs buffer layer 702. In other words, the cladding layer 703 has a lattice constant intermediate between the lattice constant of GaAs and the lattice constant of GaP.

Further, a bottom optical waveguide layer 704A of undoped AlGaInP having a composition represented as $(Al_{a2},Ga_{1-a2})_{b2}In_{1-b2}P$ (a2<a1) is formed epitaxially on the bottom cladding layer 703, wherein the compositional parameter a2 may be set to 0.15 and the compositional parameter b2 may be set equal to b1 (b2=b1).

Further, an active layer 705 of undoped GaInPAs is formed epitaxially on the bottom optical waveguide layer 704A and a top optical waveguide layer 704B of undoped AlGaInP is formed epitaxially on the optical waveguide layer 705 with the composition identical with the composition of the optical waveguide layer 704A.

In the present embodiment, an MQB layer 706 is further provided on the top optical waveguide layer 704B as an electron blocking structure, wherein the MQB layer 706 includes an alternate repetition of a barrier layer of p-type AlGaInP having a composition of $(Al_{a1},Ga_{1-a1})_{b1}In_{1-b1}P$ (0.51<b1<1) identical with the composition of the cladding layer 703 and a quantum well layer of p-type AlGaInP having a composition of $(Al_{a6},Ga_{1-a6})_{b6}In_{1-b6}P$ (a6=0.15, b6=b1), and a top cladding layer 707 of p-type AlGaInP is provided further on the MQB layer 706 with the composition identical with the composition of the bottom cladding layer 703.

Further, an intermediate layer 708 of p-type GaInP and a contact layer 709 of p-type GaPAs are formed consecutively on the top cladding layer 707 with respective compositions that achieve a lattice matching with the GaPAs buffer layer 702.

The layers 707–709 are subjected to a patterning process to form a central ridge structure extending in the axial direction of the laser diode, and is covered with an insulating layer 710 of $SiO_2$. Further, a p-type electrode 711 is provided on the insulating layer 710 so as to make an ohmic contact with the contact layer 709 at a contact opening formed in the insulating layer 710 in correspondence to the central ridge structure.

In the illustrated example, the cladding layers 703 and 707 and the optical waveguide layers 704A and 704B have a lattice constant offset by about −1% with respect to the lattice constant of GaAs.

Figure 19:
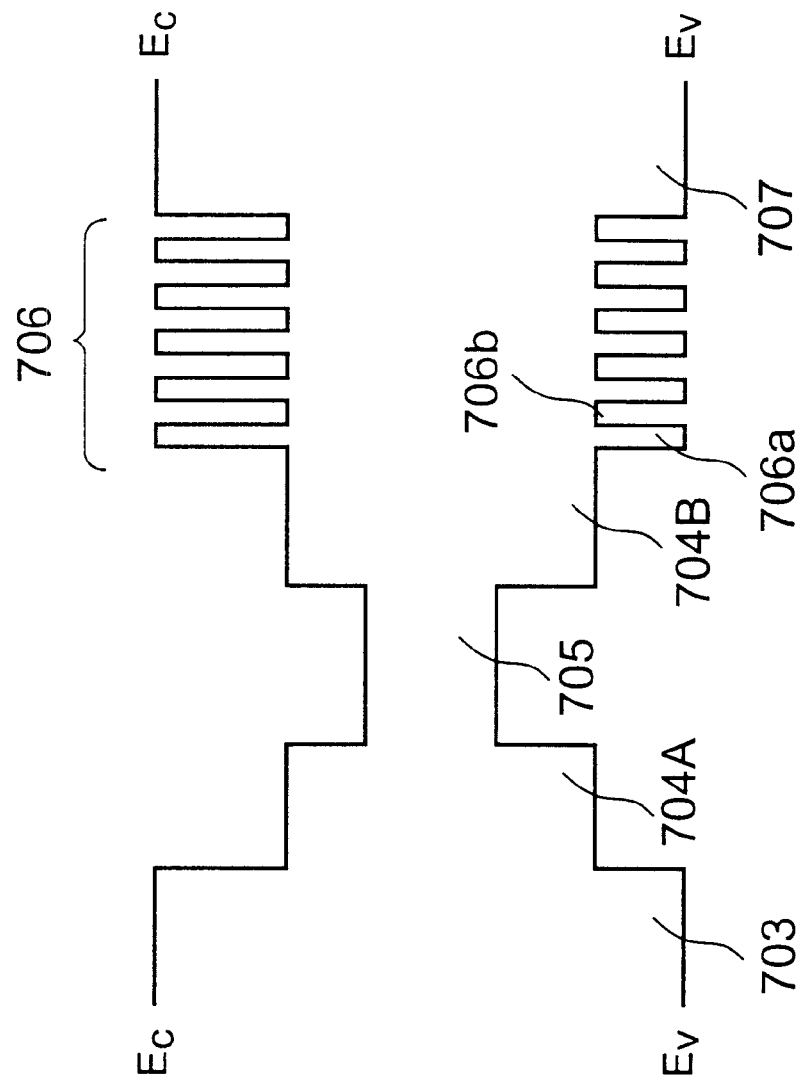
FIG. 19 is a band diagram showing the band structure of the laser diode of FIG. 18.

FIG. 19 shows the band structure of the laser diode of FIG. 18.

Referring to FIG. 19, it can be seen that there is formed a quantum well in correspondence to the active layer 705 and there occurs stimulated emission in the active layer 705 as a result of recombination of electrons and holes confined in the active layer 705, wherein the electrons are injected from the side of the bottom cladding layer 703, while the holes are injected from the side of the top cladding layer 707. Further, FIG. 19 indicates that there is formed a multiple quantum well structure in correspondence to the MQB layer 706, wherein the MQB layer 706 induces a multiple reflection of electrons therein and eliminates the escaping of the electrons from the active layer 705 to the top cladding layer 707. It should be noted that the MQB layer 706 forms an effective barrier structure against electrons. The quantum well layers 706b of the MQB structure 706 may accumulate strain as long as the thickness thereof does not exceed the critical thickness.

In one example the laser diode of the present embodiment showed a low threshold for laser oscillation at the wavelength of 630–636 nm. Further, the laser diode showed a characteristically small temperature dependence, indicating the improved carrier confinement into the active layer 705.

[Sixteenth Embodiment]

Figure 20:
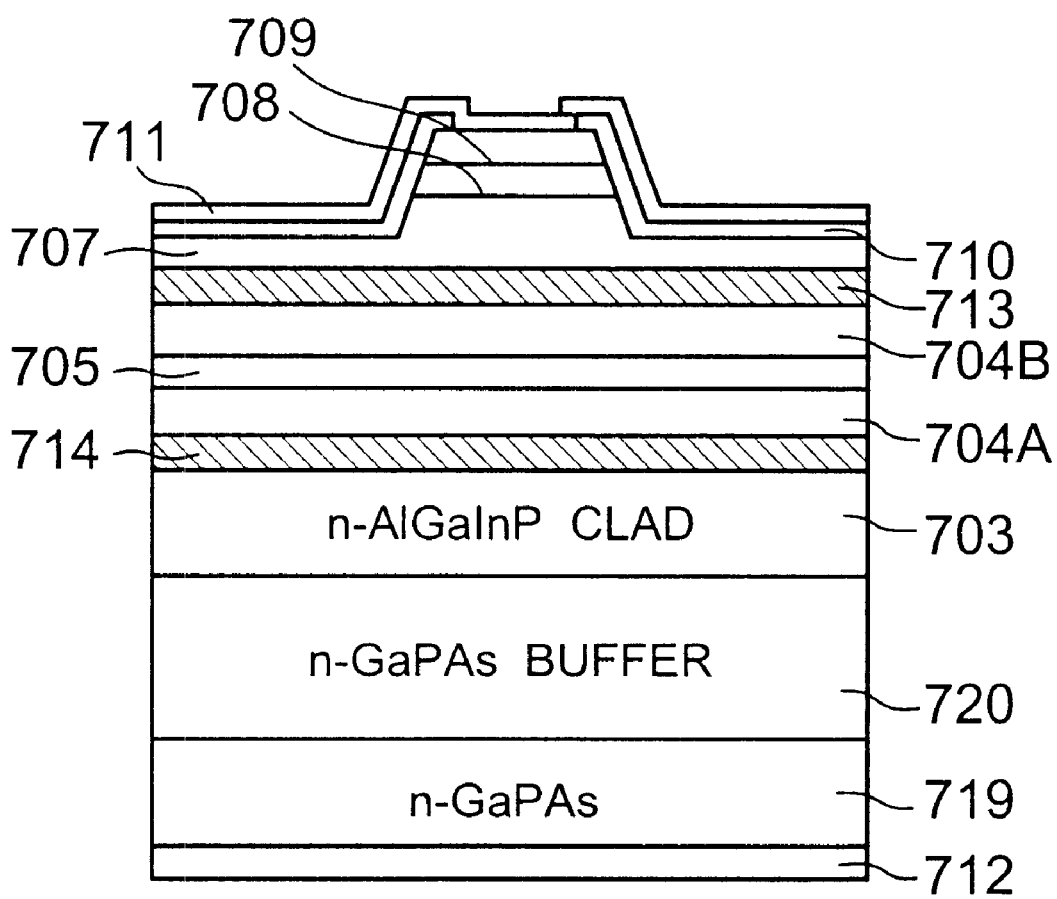
FIG. 20 is a diagram showing the construction of a laser diode according to a sixteenth embodiment of the present invention.

FIG. 20 shows the construction of a laser diode according to a sixteenth embodiment of the present invention, wherein those parts corresponding to the parts described previously are designated by the same reference numerals and the description thereof will be omitted. It should be noted that the present embodiment addresses the same problem explained in the previous embodiment with reference to FIGS. 17–19.

Referring to FIG. 20, the laser diode is now constructed on a GaPAs substrate 719 of n-type having a composition represented $GaAs_{b4}P_{1-b4}$ (b4=0.7), wherein the GaPAs substrate 719 is covered with a GaPAs buffer layer 720 of n-type having the same composition as the GaPAs substrate 719.

On the buffer layer 720, the bottom cladding layer 703 of n-type AlGaInP is formed with the composition of $(Al_{a1}, Ga_{1-a1})_{b1}In_{1-b1}P$, with the compositional parameters a1 and b1 set to 0.25 and 0.66, respectively.

In the present embodiment, a bottom carrier blocking layer 714 of n-type AlGaInP is provided on the bottom cladding layer 703 with a composition represented as $(Al_{a5}, Ga_{1-a5})_{b5}In_{1-b5}P$, wherein the compositional parameters a5 is set to 0.8 and the compositional parameter b5 is set equal to the compositional parameter b1 (b5=b1).

Further, the bottom optical waveguide layer 704A of undoped AlGaInP is formed on the carrier blocking layer 714 with the composition represented as $(Al_{a2},Ga_{1-a2})_{b2}In_{1-b2}P$, with the compositional parameter a2 being set equal to 0.15 and the compositional parameter b2 set equal to the compositional parameter b1 (b2=b1).

On the bottom optical waveguide layer 704A, the active layer 705 of undoped GaInPAs is formed, and the top optical waveguide layer 704B of undoped AlGaInP having the composition identical with the composition of the optical waveguide layer 704A is formed on the active layer 705.

Further, a top carrier blocking layer 713 of p-type AlGaInP is formed on the optical waveguide layer 704B with the composition identical with the composition of the bottom carrier blocking layer 714, and the top cladding layer 707 of p-type AlGaInP having the same composition as the bottom cladding layer 703 is formed on the top carrier blocking layer 713. On the top carrier blocking layer 713, the intermediate layer 708 and the contact layer 709 are formed similarly to the device of the previous embodiment.

Figure 21:
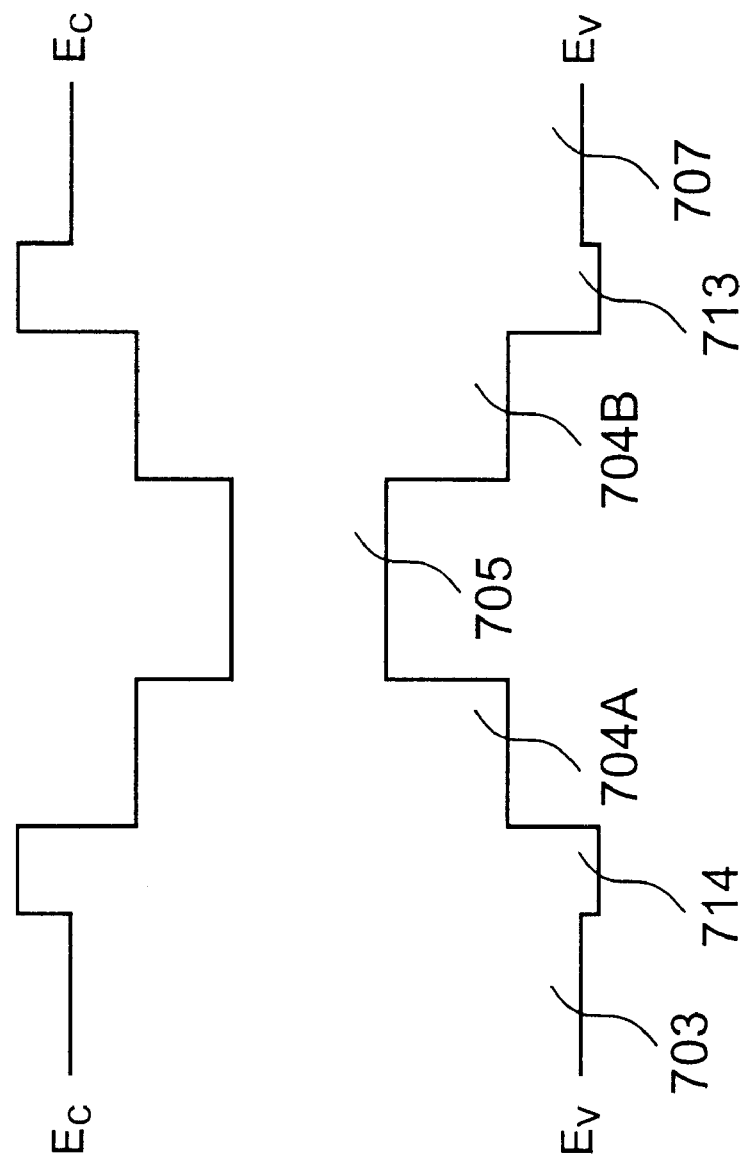
FIG. 21 is a band diagram showing the band structure of the laser diode of FIG. 20.

FIG. 21 shows the band structure of the laser diode of FIG. 21.

Referring to FIG. 21, it can be seen that there are formed a pair of potential barriers outside the optical waveguide layers 704A and 704B, wherein the potential barriers formed by the layers 713 and 714 effectively blocks the escaping of the electrons and holes injected into the active layer 705. The carrier blocking layers 713 and 714 are formed typically with a thickness of 50 nm or more for eliminating the tunneling of the carriers therethrough. As the carrier blocking layer 714 is doped to the p-type, the barrier height at the conduction band Ev is enhanced and the efficiency of electron confinement is further improved.

It should be noted that the laser diode of the present embodiment has a refractive index distribution symmetric with respect to the active layer 705. The laser diode oscillates efficiently at the wavelength of 630–636 nm.

[Seventeenth Embodiment]

Next, a laser diode according to a seventeenth embodiment of the present invention will be described with reference to FIG. 22, wherein those parts corresponding to the parts described previously are designated by the same reference numerals and the description thereof will be omitted. It should be noted that the present embodiment also addresses the problem explained in the previous embodiment with reference to FIGS. 17–19.

Figure 22:
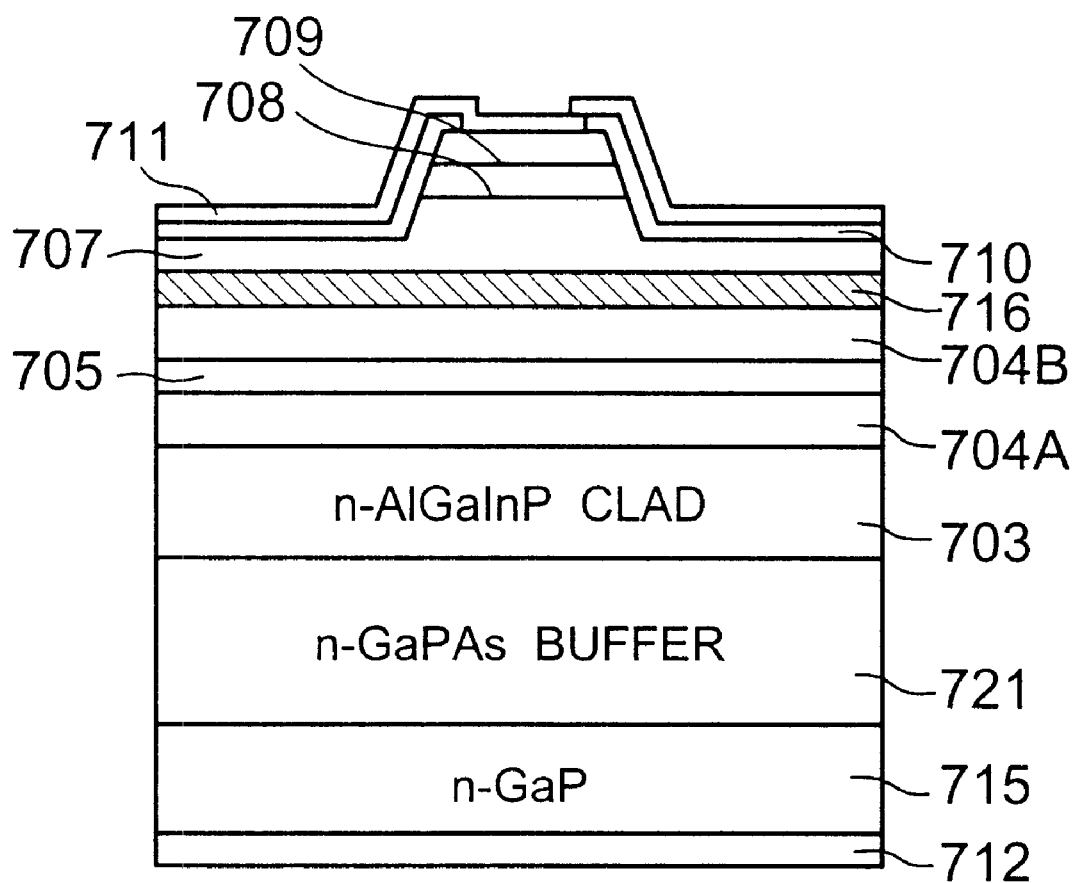
FIG. 22 is a diagram showing the construction of a laser diode according to a seventeenth embodiment of the present invention.

Referring to FIG. 22, the laser diode has a construction similar to that of the laser diode of FIG. 20 except that an n-type GaP substrate 715 is used in place of the GaAs substrate 701 or GaPAs substrate, and a corresponding buffer layer 721 of n-type GaPAs is used in place of the buffer layer 702 or 720. The buffer layer 721 changes a composition thereof gradually from GaP at the side of the substrate 715 to $GaP_{0.6}As_{0.4}$. Further, the laser diode of the present embodiment uses a carrier blocking layer 716 of p-type AlGaInP at the interface between the top optical waveguide layer 704B and the top cladding layer 707, wherein the carrier blocking layer 716 has a composition represented as $(Al_{a5},Ga_{1-a5})_{b5}In_{1-b5}P$, with the compositional parameters a5 and b5 set to 0.8 and 0.92 respectively and is formed with a thickness of about 25 nm.

In the present embodiment, the cladding layers 703 and 707 and the optical waveguide layers 704A and 704B have a lattice misfit of about −2% with respect to the lattice constant of GaAs, wherein the lattice misfit with respect to the GaP substrate 715 is effectively relaxed by the buffer layer 721.

On the other hand, the carrier blocking layer 716 of the foregoing composition has a lattice misfit of about −1% with respect to the cladding layer 707 and accumulates therein a tensile strain. As a result of the tensile strain, the potential barrier formed in the conduction band Ec by the carrier blocking layer 716 is enhanced with respect to the active layer 705 as represented in the band diagram of FIG. 23, and the efficiency of electron confinement is further improved.

Figure 23:
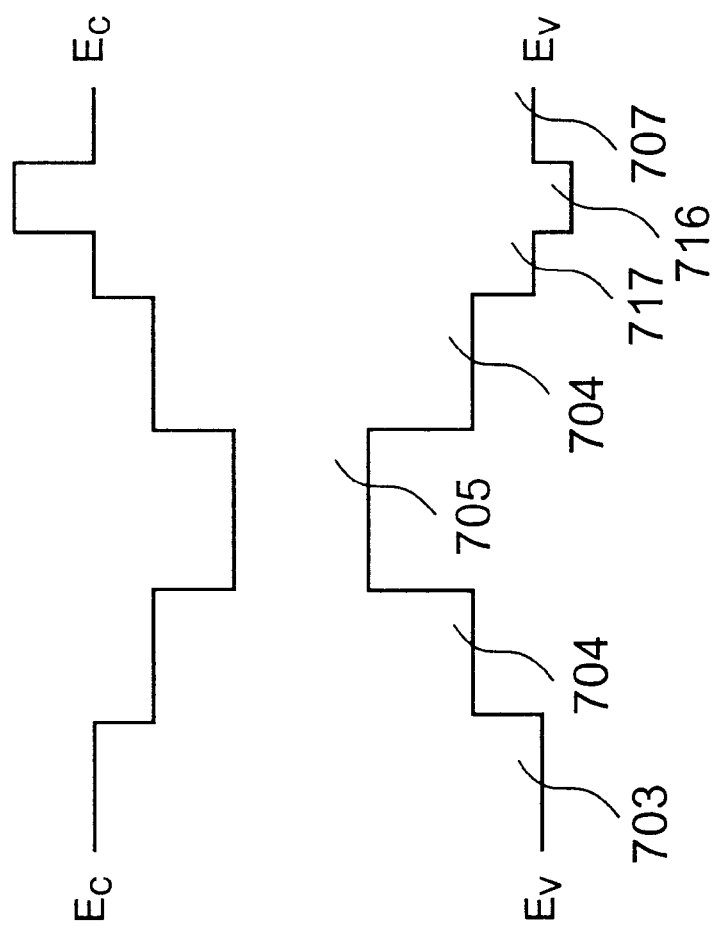
FIG. 23 is a band diagram showing the band structure of the laser diode of FIG. 22.

Referring to the band diagram of FIG. 23, it can be seen that the potential barrier associated with the carrier blocking layer 716 is formed inside the top cladding layer 707.

[Eighteenth Embodiment]

Figure 24:
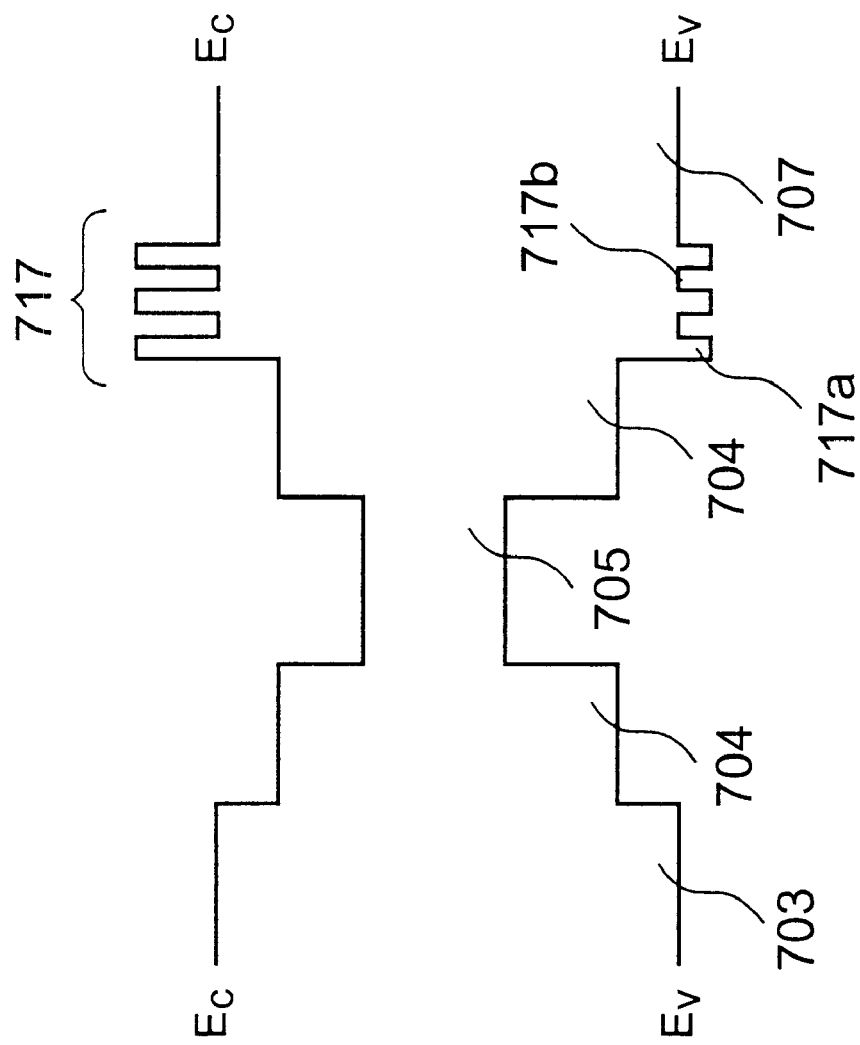
FIG. 24 is a band diagram showing the band structure of a laser diode according to an eighteenth embodiment of the present invention.

FIG. 24 shows the band diagram of the laser diode according to a nineteenth embodiment of the present invention wherein those parts corresponding to the parts described previously are designated by the same reference numerals and the description thereof will be omitted.

Referring to the band diagram of FIG. 24, the laser diode has a construction similar to that of FIG. 22 except that the carrier blocking layer 716 is replaced with an MQB layer 717.

As can be seen from FIG. 24, the MQB layer 717 includes three barrier layers 717a of p-type AlGaInP having a composition so as to accumulate a tensile strain of about 1% or more with respect to the cladding layer 707. On the other hand, quantum well layers 717b intervening between the barrier layers 717a have a composition identical with the cladding layer 707.

The construction of FIG. 24 is also effective for inducing an apparent potential barrier of electrons at the side of the p-type cladding layer 707.

[Nineteenth Embodiment]

Figure 25:
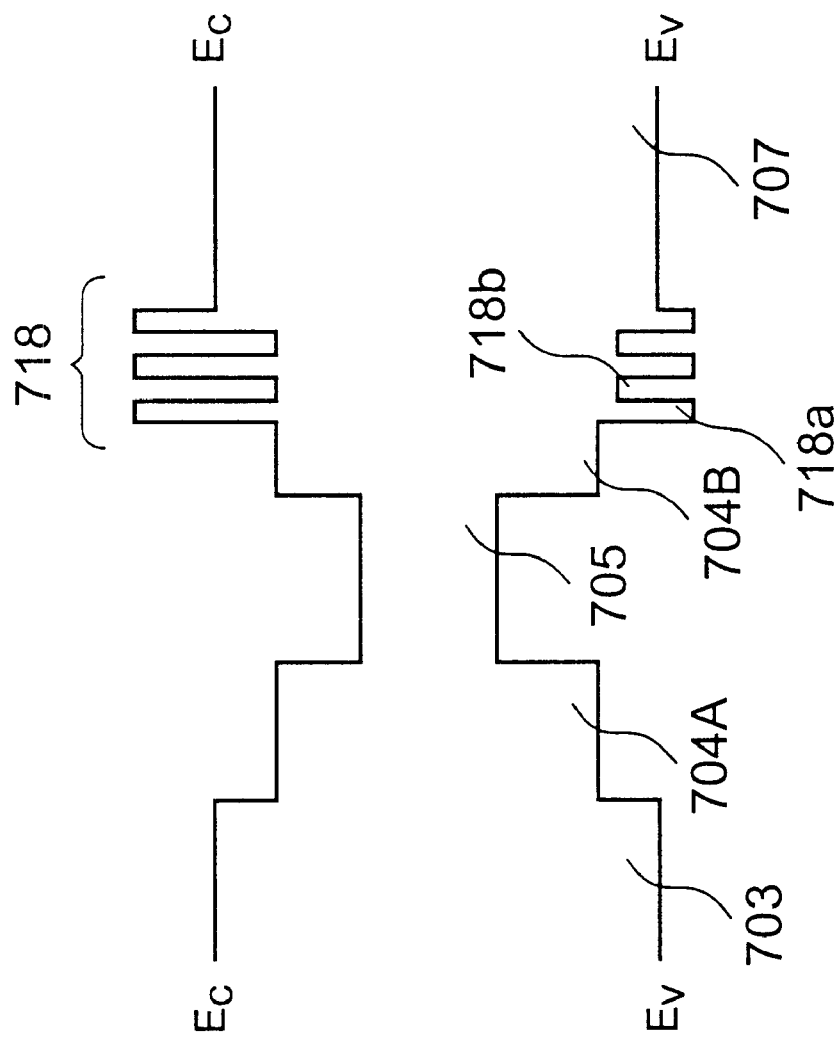
FIG. 25 is a band diagram showing the band structure of a laser diode according to a nineteenth embodiment of the present invention.

FIG. 25 shows the band diagram of a laser diode according to a nineteenth embodiment of the present invention, wherein those parts described previously with reference to preceding drawings are designated by the same reference numerals and the description thereof will be omitted. It should be noted that the present embodiment also addresses the problem explained in the previous embodiment with reference to FIGS. 17–19.

Referring to FIG. 25, the laser diode has an MQB layer 718 including three barrier layers 718a and intervening quantumwell layers 718b both of p-type AlGaInP, wherein the barrier layers 718a have a larger bandgap energy than the cladding layer 707 and a composition generally achieve a lattice matching with respect to the cladding layer 707. On the other hand, the quantum well layers 718b have a composition identical with the composition of the optical waveguide layer 704B.

The laser diode of the present embodiment also oscillates at the red optical wavelength of 630–633 with an improved efficiency as compared with the case where no such carrier blocking layer is provided.

Further, the present invention is by no means limited to the embodiments described heretofore, but various variations and modifications may be made without departing from the scope of the invention.

What is claimed is:

1. A light-emitting semiconductor device, comprising:
   a semiconductor substrate;
   an active layer provided above said semiconductor substrate, said active layer producing a red optical radiation; and
   a cladding layer provided above said semiconductor substrate adjacent to said active layer,
   said active layer comprising a III-V material in the system of AlGaInPAs having a composition represented as $(Al_xGa_{1-x})_\alpha In_{1-\alpha}P_tAs_{1-t}$ ($0\leq x<1$, $0<\alpha\leq 1$, $0\leq t\leq 1$),
   said cladding layer containing Al and comprising a III-V material in the system of AlGaInPAs having a composition represented as $(Al_yGa_{1-y})_\beta In_{1-\beta}P_vAs_{1-v}$ ($0<y\leq 1$, $0.5<\beta\leq 1$, $0<v\leq 1$), said cladding layer having a bandgap larger than a bandgap of said active layer and a lattice constant intermediate between a lattice constant of GaP and a lattice constant of GaAs.

2. A light-emitting semiconductor device as claimed in claim 1, wherein said active layer contains As and has a composition represented as $(Al_xGa_{1-x})_\alpha In_{1-\alpha}P_tAs_{1-t}$ ($0\leq x<1$, $0<\alpha\leq 1$, $0\leq t<1$).

3. A light-emitting semiconductor device as claimed in claim 1, wherein cladding layer contains As and has a composition represented as $(Al_yGa_{1-y})_\beta In_{1-\beta}P_vAs_{1-v}$ ($0<y\leq 1$, $0.5<\beta 1$, $0<v<1$).

4. A light-emitting semiconductor device as claimed in claim 1, wherein said semiconductor substrate is a GaPAs substrate.

5. A light-emitting semiconductor device as claimed in claim 1, wherein said semiconductor substrate includes one of a GaAs substrate and a GaP substrate as a base substrate, said base substrate carrying thereon a lattice relaxation buffer layer.

6. A light-emitting semiconductor device as claimed in claim 5, wherein said lattice relaxation buffer layer changes a lattice constant gradually from a bottom surface thereof to a top surface thereof.

7. A light-emitting semiconductor device as claimed in claim 5, wherein said lattice relaxation buffer layer has a strained superlattice structure including an alternate repetition of at least two semiconductor layers having respective, mutually different lattice constants.

8. A light-emitting semiconductor device as claimed in claim 5, wherein said lattice relaxation buffer layer comprises a low temperature buffer layer grown at a temperature lower than a temperature used for growing said cladding layer.

9. A light-emitting semiconductor device as claimed in claim 5, wherein said lattice relaxation buffer layer comprises one of GaInP and GaPAs.

10. A light-emitting semiconductor device as claimed in claim 5, wherein said base substrate has an inclined principal surface offset from a (100) surface to a [011] or equivalent direction, with an angle of 0–54.7°.

11. A light-emitting semiconductor device as claimed in claim 5, wherein said base substrate has an inclined principal surface offset from a (100) surface to a [0–11] or equivalent direction, with an angle of 10–54.7°.

12. A light-emitting semiconductor device as claimed in claim 5, wherein said base substrate has a polished principal surface, and wherein said relaxation buffer layer has a polished principal surface.

13. A light-emitting semiconductor device as claimed in claim 5, further including a planarizing semiconductor layer interposed between said semiconductor substrate and said cladding layer, said planarizing semiconductor layer having a top surface having a superior flatness over a bottom surface facing said semiconductor substrate.

14. A light-emitting semiconductor device as claimed in claim 13, wherein said planarizing semiconductor layer comprises a GaInP layer containing Se with a concentration level of $5 \times 10^{18} cm^{-3}$ or more.

15. A light-emitting semiconductor device as claimed in claim 5, wherein said relaxation buffer layer comprises a GaInP layer containing Se with a concentration level of $5 \times 10^{18} cm^{-3}$ or more.

16. A light-emitting semiconductor device, comprising:

a semiconductor substrate;

an active layer provided above said semiconductor substrate, said active layer producing a red optical radiation;

a cladding layer provided above said semiconductor substrate adjacent to said active layer; and an optical waveguide layer interposed between said active layer and said cladding layer, said active layer comprising a single quantum well layer of a III-V material in the system of AlGaInPAs having a composition represented as $(Al_xGa_{1-x})_\alpha In_{1-\alpha}P_tAs_{1-t}$ ($0 \leq x \leq 1$, $0 < \alpha \leq 1$, $0 \leq t \leq 1$), said cladding layer containing Al and comprising a III-V material in the system of AlGaInPAs having a composition represented as $(Al_yGa_{1-y})_\beta In_{1-\beta}P_vAs_{1-v}$ ($0 < y \leq 1$, $0.5 < \beta \leq 1$, $0 < v \leq 1$), said cladding layer having a bandgap larger than a bandgap of said active layer and a lattice constant intermediate between a lattice constant of GaP and a lattice constant of GaAs, said optical waveguide layer comprising a III-V material in the system of AlGaInPAs having a composition represented as $(Al_zGa_{1-z})_\gamma In_{1-\gamma}P_uAs_{1-u}$ ($0 \leq z < 1$, $0.5 < \gamma \leq 1$, $0 < u \leq 1$), said optical waveguide layer having a bandgap larger than said bandgap of said active layer but smaller than said bandgap of said cladding layer.

17. A light-emitting semiconductor device as claimed in claim 16, wherein said active layer contains As and has a composition represented as $(Al_xGa_{1-x})_\alpha In_{1-\alpha}P_tAs_{1-t}$ ($0 \leq x < 1$, $0 < \alpha \leq 1$, $0 \leq t < 1$).

18. A light-emitting semiconductor device as claimed in claim 16, wherein said optical waveguide layer is substantially free from Al and has a composition represented as $Ga_\gamma In_{1-\gamma}P_uAs_{1-u}$ ($0.5 < \gamma < 1$, $0 < u \leq 1$).

19. A light-emitting semiconductor device as claimed in claim 16, wherein cladding layer contains As and has a composition represented as $(Al_yGa_{1-y})_\beta In_{1-\beta}P_vAs_{1-v}$ ($0 < y \leq 1$, $0.5 < \beta \leq 1$, $0 < v < 1$).

20. A light-emitting semiconductor device as claimed in claim 16, wherein said quantum well layer has a lattice constant larger than a lattice constant of said cladding layer, said quantum well layer thereby accumulating a compressive strain therein.

21. A light-emitting semiconductor device as claimed in claim 16, wherein said semiconductor substrate is a GaPAs substrate.

22. A light-emitting semiconductor device as claimed in claim 16, wherein said semiconductor substrate includes one of a GaAs substrate and a GaP substrate as a base substrate, said base substrate carrying thereon a lattice relaxation buffer layer.

23. A light-emitting semiconductor device as claimed in claim 22, wherein said lattice relaxation buffer layer changes a lattice constant gradually from a bottom surface thereof to a top surface thereof.

24. A light-emitting semiconductor device as claimed in claim 22, wherein said lattice relaxation buffer layer has a strained superlattice structure including an alternate repetition of at least two semiconductor layers having respective, mutually different lattice constants.

25. A light-emitting semiconductor device as claimed in claim 22, wherein said lattice relaxation buffer layer comprises a low temperature buffer layer grown at a temperature lower than a temperature used for growing said cladding layer.

26. A light-emitting semiconductor device as claimed in claim 22, wherein said lattice relaxation buffer layer comprises one of GaInP and GaPAs.

27. A light-emitting semiconductor device as claimed in claim 22, wherein said base substrate has an inclined principal surface offset from a (100) surface to a [011] or equivalent direction, with an angle of 0–54.7°.

28. A light-emitting semiconductor device as claimed in claim 22, wherein said base substrate has an inclined principal surface offset from a (100) surface to a [0–11] or equivalent direction, with an angle of 10–54.7°.

29. A light-emitting semiconductor device as claimed in claim 22, wherein said base substrate has a polished principal surface, and wherein said relaxation buffer layer has a polished principal surface.

30. A light-emitting semiconductor device as claimed in claim 22, further including a planarizing semiconductor layer interposed between said semiconductor substrate and said cladding layer, said planarizing semiconductor layer having a top surface having a superior flatness over a bottom surface facing said semiconductor substrate.

31. A light-emitting semiconductor device as claimed in claim 30, wherein said planarizing semiconductor layer comprises a GaInP layer containing Se with a concentration level of $5 \times 10^{18} \text{cm}^{-3}$ or more.

32. A light-emitting semiconductor device as claimed in claim 22, wherein said relaxation buffer layer comprises a GaInP layer containing Se with a concentration level of $5 \times 10^{18} \text{cm}^{-3}$ or more.

33. A light-emitting semiconductor device, comprising:
a semiconductor substrate;
an active layer provided above said semiconductor substrate, said active layer producing a red optical radiation;
a cladding layer provided above said semiconductor substrate adjacent to said active layer; and
an optical waveguide layer interposed between said active layer and said cladding layer,
said active layer having a multiple quantum well structure comprising a plurality of quantum well layers of a III-V material in the system of AlGaInPAs having a composition represented as $(Al_{x1}Ga_{1-x})_{\alpha 1}In_{1-\alpha 1}P_{t1}As_{1-t1}$ ($0 \leq x1 < 1$, $0 < \alpha 1 \leq 1$, $0 \leq t1 \leq 1$) and a plurality of barrier layers of a III-V material in the system of AlGaInPAs having a composition represented as $(Al_{x2}Ga_{1-x2})_{\alpha 2}In_{1-\alpha 2}P_{t2}As_{1-t2}$ ($0 \leq x2 < 1$, $0 < \alpha 2 < 1$, $0 \leq t2 \leq 1$), each of said barrier layers having a bandgap larger than a bandgap of said quantum well layer,
said cladding layer containing Al and comprising a III-V material in the system of AlGaInPAs having a composition represented as $(Al_yGa_{1-y})_\beta In_{1-\alpha}P_vAs_{1-v}$ ($0 < y \leq 1$, $0.5 < \beta \leq 1$, $0 < v \leq 1$), said cladding layer having a bandgap larger than a bandgap of said quantum well layer in said active layer and a lattice constant intermediate between a lattice constant of GaP and a lattice constant of GaAs,
said optical waveguide layer comprising a III-V material in the system of AlGaInPAs having a composition represented as $(Al_zGa_{1-z})_\gamma In_{1-\gamma}P_uAs_{1-u}$ ($0 \leq z < 1$, $0.5 < \gamma \leq 1$, $0 < u \leq 1$), said optical waveguide layer having a bandgap larger than said bandgap of said quantum well layer in said active layer but smaller than said bandgap of said cladding layer.

34. A light-emitting semiconductor device as claimed in claim 33, wherein said active layer contains As and has a composition represented as $(Al_xGa_{1-x})_\alpha In_{1-\alpha}P_tAs_{1-t}$ ($0 \leq x < 1$, $0 < \alpha \leq 1$, $0 \leq t < 1$).

35. A light-emitting semiconductor device as claimed in claim 33, wherein said optical waveguide layer is substantially free from Al and has a composition represented as $Ga_yIn_{1-\gamma}P_uAs_{1-u}$ ($0.5 < \gamma < 1$, $0 < u \leq 1$).

36. A light-emitting semiconductor device as claimed in claim 33, wherein cladding layer contains As and has a composition represented as $(Al_yGa_{1-y})_\beta In_{1-\beta}P_vAs_{1-v}$ ($0 < y \leq 1$, $0.5 < \beta \leq 1$, $0 < v < 1$).

37. A light-emitting semiconductor device as claimed in claim 33, wherein said quantum well layer has a lattice constant larger than a lattice constant of said cladding layer, said quantum well layer thereby accumulating a compressive strain therein.

38. A light-emitting semiconductor device as claimed in claim 33, wherein said semiconductor substrate is a GaPAs substrate.

39. A light-emitting semiconductor device as claimed in claim 33, wherein said semiconductor substrate includes one of a GaAs substrate and a GaP substrate as a base substrate, said base substrate carrying thereon a lattice relaxation buffer layer.

40. A light-emitting semiconductor device as claimed in claim 39, wherein said lattice relaxation buffer layer changes a lattice constant gradually from a bottom surface thereof to a top surface thereof.

41. A light-emitting semiconductor device as claimed in claim 39, wherein said lattice relaxation buffer layer has a strained superlattice structure including an alternate repetition of at least two semiconductor layers having respective, mutually different lattice constants.

42. A light-emitting semiconductor device as claimed in claim 39, wherein said lattice relaxation buffer layer comprises a low temperature buffer layer grown at a temperature lower than a temperature used for growing said cladding layer.

43. A light-emitting semiconductor device as claimed in claim 39, wherein said lattice relaxation buffer layer comprises one of GaInP and GaPAs.

44. A light-emitting semiconductor device as claimed in claim 39, wherein said base substrate has an inclined principal surface offset from a (100) surface to a [011] or equivalent direction, with an angle of 0–54.7°.

45. A light-emitting semiconductor device as claimed in claim 39, wherein said base substrate has an inclined principal surface offset from a (100) surface to a [0–11] or equivalent direction, with an angle of 10–54.7°.

46. A light-emitting semiconductor device as claimed in claim 39, wherein said base substrate has a polished principal surface, and wherein said relaxation buffer layer has a polished principal surface.

47. A light-emitting semiconductor device as claimed in claim 39, further including a planarizing semiconductor layer interposed between said semiconductor substrate and said cladding layer, said planarizing semiconductor layer having a top surface having a superior flatness over a bottom surface facing said semiconductor substrate.

48. A light-emitting semiconductor device as claimed in claim 47, wherein said planarizing semiconductor layer comprises a GaInP layer containing Se with a concentration level of $5 \times 10^{18} \text{cm}^{-3}$ or more.

49. A light-emitting semiconductor device as claimed in claim 39, wherein said relaxation buffer layer comprises a GaInP layer containing Se with a concentration level of $5 \times 10^{18} \text{cm}^{-3}$ or more.

50. A laser diode, comprising:
a semiconductor substrate;
a first cladding layer of AlGaInP provided above said semiconductor substrate, said first cladding layer having a first conductivity type and a lattice constant intermediate between a lattice constant of GaAs and a lattice constant of GaP;
an active layer of GaInPAs provided above said first cladding layer;
a second cladding layer of AlGaInP provided above said active layer, said second cladding layer having a second conductivity type and a lattice constant substantially identical with said lattice constant of said first cladding layer;
an etching stopper layer of GaInP provided above said second cladding layer, said etching stopper layer having said second conductivity type;
a third cladding layer of AlGaInP provided above said etching stopper layer, said third cladding layer having said second conductivity type and a lattice constant substantially identical with said lattice constant of said first cladding layer:
said etching stopper layer having a lattice constant generally equal to said lattice constant of said first cladding layer and a bandgap substantially larger than a bandgap of said active layer.

51. A laser diode as claimed in claim 50, further comprising, in at least one of a location between said first cladding layer and said active layer and a location between said active layer and said second cladding layer, an optical waveguide layer of GaInP, said optical waveguide layer being free from Al and having a bandgap larger than said bandgap of said active layer.

52. A laser diode as claimed in claim 50, further including a current-confinement structure above said etching stopper layer such that said current-confinement structure defines a stripe region extending in an axial direction of said laser diode.

53. A laser diode as claimed in claim 52, wherein said current-confinement structure has a bandgap larger than said bandgap of said active layer and a refractive index smaller than a refractive index of said second and third cladding layers.

54. A laser diode as claimed in claim 50, wherein said semiconductor substrate comprises a base substrate having a composition selected from of one of GaAs and GaP, and a lattice relaxation buffer layer formed on said base substrate.

55. A light-emitting semiconductor device, comprising:
a semiconductor substrate;
a first cladding layer of n-type AlGaInP provided above said semiconductor substrate, said first cladding layer having a composition represented as $(Al_{x1}Ga_{1-x1})_{y1}In_{1-y1}P$ ($0<x1\leq1$, $0.51<y1\leq1$) and a lattice constant intermediate between a lattice constant of GaAs and a lattice constant of GaP;
an active layer provided above said first cladding layer;
a second cladding layer of p-type AlGaInP provided above said active layer, said second cladding layer having a composition substantially identical with said composition of said first cladding layer;
wherein a multiple quantum barrier structure is interposed between said active layer and said second cladding layer,
said multiple quantum barrier structure comprising an alternate repetition of a quantum well layer having a composition represented as $(Al_{x2}Ga_{1-x2})_{y2}In_{1-y2}P$ ($0\leq x2\leq1$, $0\leq y1\leq1$) and a bandgap smaller than a bandgap of said second cladding layer, and a barrier layer having a composition substantially identical with said composition of said second cladding layer.

56. A lighting-emitting semiconductor device as claimed in claim 55, further including a first optical waveguide layer between said active layer and said first cladding layer and a second optical waveguide layer between said active layer and said second cladding layer, and wherein said multiple quantum well structure is formed at least between said second optical waveguide layer and said second cladding layer.

57. A light-emitting semiconductor device as claimed in claim 55, further comprising another multiple quantum barrier structure such that said multiple quantum barrier structure and said another quantum barrier structure are in a symmetrical relationship with respect to said active layer.

58. A light-emitting semiconductor device, comprising:
a semiconductor substrate;
a first cladding layer of n-type AlGaInP provided above said semiconductor substrate, said first cladding layer having a composition represented as $(Al_{x1}Ga_{1-x1})_{y1}In_{1-y1}P$ ($0\leq x1\leq1$, $0.51<y1\leq1$) and a lattice constant intermediate between a lattice constant of GaAs and a lattice constant of GaP;
an active layer provided above said first cladding layer;
a second cladding layer of p-type AlGaInP provided above said active layer, said second cladding layer having a composition substantially identical with said composition of said first cladding layer;
wherein a carrier blocking layer is interposed at least between said active layer and said second cladding layer, said carrier blocking layer having a composition represented as $(Al_{x3}Ga_{1-x3})_{y1}In_{1-y1}P$ ($0\leq x1\leq x3\leq1$, $0.51<y1\leq1$) and a bandgap larger than a bandgap of said second cladding layer, said carrier blocking layer having a lattice constant generally matching with a lattice constant of said second cladding layer.

59. A light-emitting semiconductor device as claimed in claim 58, further including a first optical waveguide layer between said active layer and said first cladding layer and a second optical waveguide layer between said active layer and said second cladding layer, and wherein said carrier blocking layer is formed between said second optical waveguide layer and said second cladding layer.

60. A light-emitting semiconductor device as claimed in claim 58, further comprising another carrier blocking layer such that said carrier blocking layer and said another carrier blocking layer are in a symmetrical relationship with respect to said active layer.

61. A light-emitting semiconductor device, comprising:
a semiconductor substrate;
a first cladding layer of n-type AlGaInP provided above said semiconductor substrate, said first cladding layer having a composition represented as $(Al_{x1}Ga_{1-x1})_{y1}In_{1-y1}P$ ($0\leq x1\leq1$, $0.51<y1\leq1$) and a lattice constant intermediate between a lattice constant of GaAs and a lattice constant of GaP;
an active layer provided above said first cladding layer;
a second cladding layer of p-type AlGaInP provided above said active layer, said second cladding layer having a composition substantially identical with said composition of said first cladding layer;
wherein a carrier blocking layer is interposed at least between said active layer and said second cladding layer, said carrier blocking layer having a composition represented as $(Al_{x4}Ga_{1-x4})_{y4}In_{1-y4}P$ ($0\leq x4\leq1$, $0.51<y1<y4\leq1$) and a bandgap larger than a bandgap of said second cladding layer, said carrier blocking layer having a lattice constant smaller than a lattice constant of said second cladding layer.

62. A light-emitting semiconductor device as claimed in claim 61, further including a first optical waveguide layer between said active layer and said first cladding layer and a second optical waveguide layer between said active layer and said second cladding layer, and wherein said carrier blocking layer is formed at least between said second optical waveguide layer and said second cladding layer.

63. A light-emitting semiconductor device as claimed in claim 61, further comprising another carrier blocking layer such that said carrier blocking layer and said another carrier blocking layer are in a symmetrical relationship with respect to said active layer.

* * * * *